United States Patent
Hirano

(10) Patent No.: US 8,912,590 B2
(45) Date of Patent: Dec. 16, 2014

(54) SEMICONDUCTOR DEVICE INCLUDING MONOS-TYPE MEMORY CELL

(75) Inventor: Yuichi Hirano, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 72 days.

(21) Appl. No.: 13/471,949

(22) Filed: May 15, 2012

(65) Prior Publication Data

US 2012/0306001 A1  Dec. 6, 2012

(30) Foreign Application Priority Data

May 30, 2011 (JP) ................. 2011-120058

(51) Int. Cl.

| | | |
|---|---|---|
| H01L 29/792 | (2006.01) | |
| H01L 29/66 | (2006.01) | |
| H01L 29/78 | (2006.01) | |
| H01L 29/423 | (2006.01) | |
| H01L 27/115 | (2006.01) | |
| H01L 21/28 | (2006.01) | |
| H01L 21/8238 | (2006.01) | |

(52) U.S. Cl.
CPC ...... *H01L 27/11573* (2013.01); *H01L 29/7843* (2013.01); *H01L 29/4234* (2013.01); *H01L 29/6659* (2013.01); *H01L 29/6653* (2013.01); *H01L 29/7833* (2013.01); *H01L 29/66833* (2013.01); *H01L 29/665* (2013.01); *H01L 21/28282* (2013.01); *H01L 29/792* (2013.01); *H01L 21/823807* (2013.01); *H01L 21/823864* (2013.01)
USPC ........... 257/324; 257/325; 257/326; 257/410; 257/411

(58) Field of Classification Search
None
See application file for complete search history.

(56) References Cited

U.S. PATENT DOCUMENTS

| | | | | |
|---|---|---|---|---|
| 6,159,809 | A | * | 12/2000 | Togo .............................. 438/301 |
| 7,115,954 | B2 | | 10/2006 | Shimizu et al. |
| 7,872,298 | B2 | | 1/2011 | Shimamoto et al. |
| 8,344,444 | B2 | | 1/2013 | Kawashima et al. |
| 2009/0206414 | A1 | * | 8/2009 | Sudo ............................. 257/369 |
| 2010/0200909 | A1 | * | 8/2010 | Kawashima et al. ......... 257/326 |

FOREIGN PATENT DOCUMENTS

| | | |
|---|---|---|
| JP | 2008-041832 | 2/2008 |
| JP | 2009-70918 A | 4/2009 |
| JP | 2010-183022 A | 8/2010 |
| JP | 2010-205791 A | 9/2010 |
| WO | 02/43151 A1 | 5/2002 |

OTHER PUBLICATIONS

X. Chen et al., "Stress Proximity Technique for Performance Improvement with Dual Stress Linear at 45 nm Technology and Beyond," 2006 Symposium on VLSI Technology Digest of Technical Papers, The Japan Society of Applied Physics.
Notification of Reasons for Refusal Japanese Patent Application No. 2011-120058 dated Sep. 30, 2014 with English translation.

\* cited by examiner

*Primary Examiner* — Steven Loke
*Assistant Examiner* — Juanita B Rhodes
(74) *Attorney, Agent, or Firm* — McDermott Will & Emery LLP

(57) ABSTRACT

A semiconductor device includes a semiconductor substrate having a main surface, a MONOS-type memory cell formed over the main surface and having a channel, an n-channel transistor formed over the main surface, and a p-channel transistor formed over the man surface. Nitride films are formed in a manner to contact the top surfaces of the MONOS-type memory cell, the n-channel transistor, and the p-channel transistor. The nitride films apply stress to the channels of the MONOS-type memory cell, the n-channel transistor, and the p-channel transistor.

8 Claims, 29 Drawing Sheets

SEMICONDUCTOR DEVICE INCLUDING MONOS-TYPE MEMORY CELL

CROSS-REFERENCE TO RELATED APPLICATION

The disclosure of Japanese Patent Application Publication No. 2011-120058 filed on May 30, 2011 including the specification, drawings and abstract is incorporated herein by reference in its entirety.

BACKGROUND

The present invention relates to a semiconductor device and a manufacturing method thereof and in particular to a semiconductor device including a field-effect transistor and a manufacturing method thereof.

Conceivable examples of a semiconductor device including a flash memory or central processing unit (CPU) include microcomputers. A microcomputer generally has a structure having many metal oxide semiconductor (MOS) transistors formed on a semiconductor substrate.

A preferred example of a flash memory is a non-volatile memory, which is a device that retains recorded information even when turned off. A logic circuit such as a CPU is preferably a complementary metal oxide semiconductor (CMOS) transistor, a combination of so-called n-channel and p-channel MOS transistors. Examples of a non-volatile memory include a transistor according to metal oxide nitride oxide silicon (MONOS) technology disclosed in Japanese Unexamined Patent Application Publication No. 2008-41832. Herein, a memory cell according to MONOS technology which is used as a flash memory is referred to as an FMONOS (flash metal oxide nitride oxide semiconductor) memory cell. By forming FMONOS-type memory cells and CMOS transistors on a semiconductor substrate, a high-functionality microcomputer is formed. Such a microcomputer is used in industrial machines, household electrical appliances, car-mounted systems, and the like.

Meanwhile, a technology for increasing the drive current flowing between the source and drain of n-channel and p-channel MOS transistors forming a CMOS transistor is disclosed in X. CHEN, S. FANG et al, "Stress Proximity Technique for Performance Improvement with Dual Stress Liner at 45 nm Technology and Beyond," 2006 Symposium on VLSI Technology Digest of Technical Papers, United States, 2006 IEEE, 2006, 1-4244-0005-8/06/$20.00. This literature discloses a technology called "stress proximity technique (SPT)," that is, a technology that forms a thin film for applying stress to the channel regions of n-channel and p-channel MOS transistors in a manner to cover the MOS transistors. This literature also states that, in the MOS transistors according to the SPT, elimination of a side wall insulating film of a gate electrode increases stress applied to the channel region by the thin film.

SUMMARY

However, if the side wall insulating film formed over the gate electrode of the FMONOS-type memory cell is eliminated in order to use the SPT, a nitride film (nitride insulator layer) is disadvantageously simultaneously eliminated. Specifically, when the silicon nitride film formed over the gate electrode of the FMONOS-type memory cell is eliminated, a silicon nitride film for storing electric charge in order to drive the FMONOS-type memory cell may be eliminated simultaneously. The silicon nitride film for storing electric charge of the FMONOS-type memory cell is usually disposed both alongside and below the gate electrode. Even when the silicon nitride film disposed alongside the gate electrode is eliminated, the functionality of the FMONOS-type memory cell is less affected. On the other hand, when the silicon nitride film disposed below the gate electrode is eliminated, the functionality of the FMONOS-type memory cell may not be obtained.

In wet etching, for example, the silicon nitride film is eliminated from above. That is, first, the nitride film alongside the gate electrode is eliminated and then the nitride film below the gate electrode is eliminated. If wet etching is performed at a high etching rate, both the side and below nitride films will be eliminated. If the nitride film below the gate electrode is eliminated, the functionality of the FMONOS-type memory cell will be impaired.

An advantage of the present invention is to provide a semiconductor device that includes both FMONOS-type memory cells and CMOS transistors and that increases the drive current of the transistor and maintains the functionality of the FMONOS-type memory cells, and a method manufacturing thereof.

A first aspect of the present invention provides a semiconductor device. The semiconductor device includes: a semiconductor substrate having a main surface; a MONOS-type memory cell formed over the main surface and having a channel; an n-channel transistor formed over the main surface; a p-channel transistor formed over the main surface; and a nitride film formed in a manner to contact respective top surfaces of the MONOS-type memory cell, the n-channel transistor, and the p-channel transistor. The nitride film applies stress to the channels of the MONOS-type memory cell, the n-channel transistor, and the p-channel transistor.

A second aspect of the present invention provides a method for manufacturing a semiconductor device by preparing a semiconductor substrate having a main surface and forming a MONOS-type memory cell, an n-channel transistor, and a p-channel transistor over the main surface. The method includes the steps of: forming a nitride insulator layer that stores electric charge in the MONOS-type memory cell; forming gate electrodes included in the MONOS-type memory cell, the n-channel transistor, and the p-channel transistor; forming a side wall silicon oxide film and a side wall silicon nitride film in this order over a side wall surface of each gate electrode; forming a protective film in a manner to contact a top surface of the nitride insulator layer in a region where the MONOS-type memory cell is to be formed; eliminating the side wall silicon nitride film in a region where the p-channel transistor is to be formed, in a state where the protective film is formed; and forming a nitride film in a manner to contact respective top surfaces of the region where the MONOS-type memory cell is to be formed, a region where the n-channel transistor is to be formed, and the region where the p-channel transistor is to be formed, the nitride film being intended to apply stress to a channel.

According to the second aspect of the present invention, a nitride film for applying stress to all the channels is formed over all the top surfaces of the MONOS-type memory cell, the n-channel transistor, and the p-channel transistor. This can increase the on-off ratio of the MONOS-type memory cell, as well as can increase the drive current of the n-channel and p-channel transistors and enhance the functionality of the entire semiconductor device.

According to the manufacturing method according to the second aspect of the present invention, the side wall silicon nitride film of the p-channel transistor is eliminated in a state where the top surface of the nitride semiconductor layer included in the MONOS-type memory cell is covered by the protective film. This can prevent the nitride semiconductor layer from being eliminated along with the side wall silicon nitride film of the p-channel transistor. Further, the nitride film for applying stress to all the channels is formed over all the top surfaces of the MONOS-type memory cell, the n-channel transistor, and the p-channel transistor. This can maintain the functionality of all of the memory cell and transistors, as well as can increase the drive current of the n-channel and p-channel transistors and increase the on-off ratio of the MONOS-type memory cell.

DETAILED DESCRIPTION

Now, embodiments of the present invention will be described on the basis of the accompanying drawings.

First Embodiment

Figure 1:
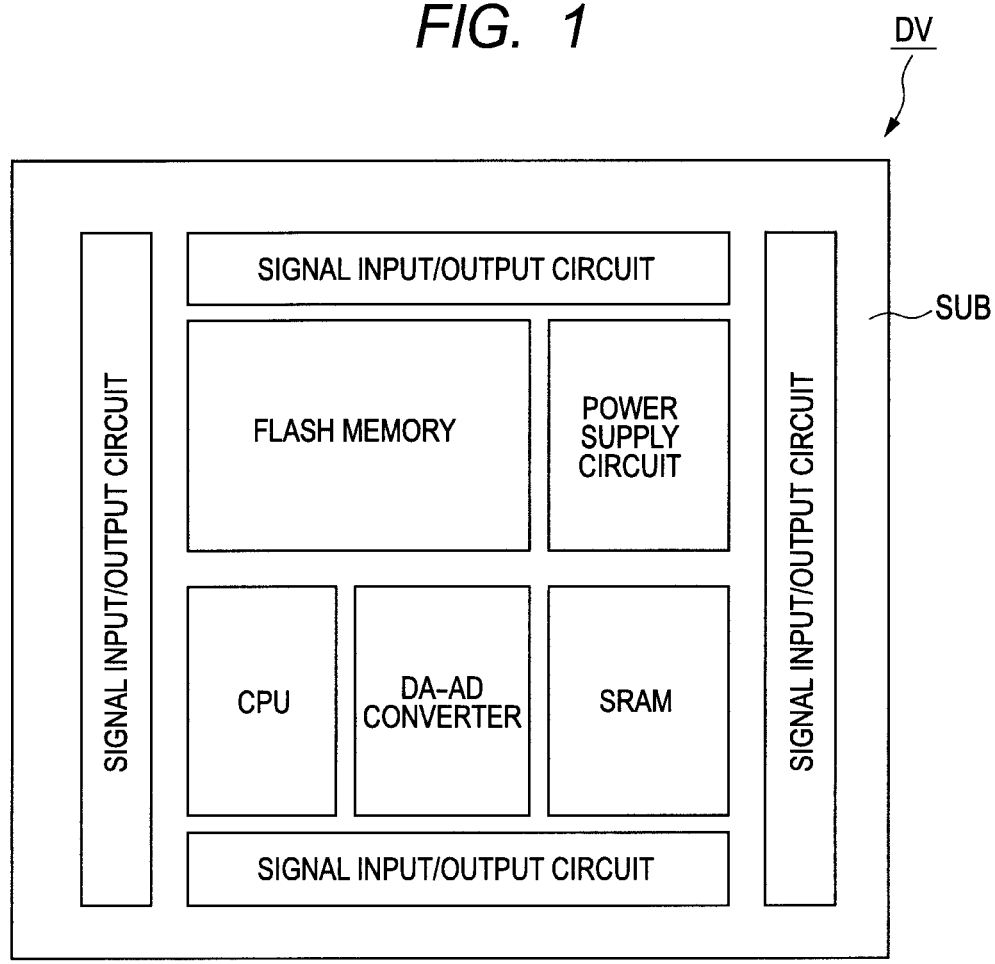
FIG. 1 is a schematic plan view of a semiconductor device according to a first embodiment of the present invention.

Referring to FIG. 1, a semiconductor device DV according to a first embodiment of the present invention has multiple circuits formed over a main surface of a semiconductor substrate SUB. The semiconductor substrate SUB is, for example, a semiconductor wafer including silicon monocrystal. Examples of the circuits forming the semiconductor device DV include a signal input/output circuit, a DA-AD converter, a power supply circuit, a CPU, a flash memory, and a static random access memory (SRAM).

The functions of the circuits forming the semiconductor device DV are as follows. The signal input/output circuits receive or output electric signals from or to circuits disposed outside the semiconductor device DV. The DA-AD converter performs conversion between analog signals and digital signals. The power supply circuit supplies electric power necessary to drive the semiconductor device DV and controls the electric power. In the CPU, a logic circuit performs logic operations. The flash memory and SRAM store data.

Of these circuits, the flash memory includes semiconductor devices such as FMONOS-type memory cells, and the CPU includes semiconductor devices such as n-channel MOS transistors and p-channel MOS transistors or combinations thereof, CMOS transistors.

Figure 2:
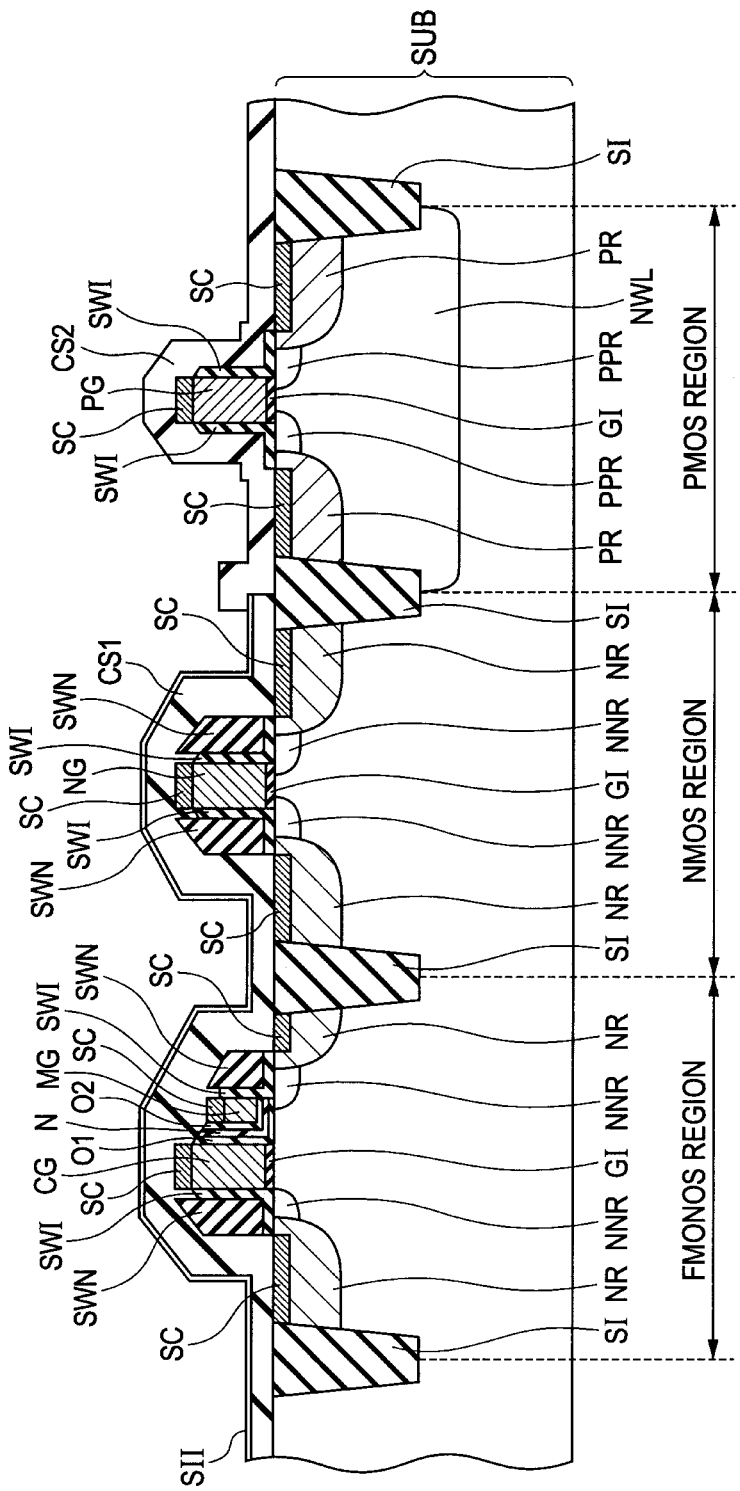
FIG. 2 is a schematic sectional view showing the configurations of a MONOS-type memory cell, an n-channel transistor, and a p-channel transistor in a region where a flash memory and a CPU are formed.

Referring to FIG. 2, in the region where the flash memory of FIG. 1 is to be formed, the region where a MONOS (FMONOS)-type memory cell is to be formed is referred to as an FMONOS region. In the region where the CPU of FIG. 1 is to be formed, the region where an n-channel MOS transistor (n-channel transistor) is to be formed is referred to as an NMOS region, and the region where a p-channel MOS transistor (p-channel transistor) is to be formed is referred to as a PMOS region.

Referring to FIG. 2, the semiconductor device according to this embodiment has an FMONOS region, an NMOS region, and a PMOS region. These regions are disposed over the semiconductor substrate SUB containing, e.g., a p-channel impurity and isolated from each other by a device isolation structure composed of, e.g., a trench isolation structure SI.

Referring to FIG. 2, an FMONOS (MONOS-type memory cell) is formed in the FMONOS region; an NMOS (n-channel transistor) is formed in the NMOS region; and a PMOS (p-channel transistor) is formed in the PMOS region. The PMOS is formed in an n-type well region NWL over the main surface of the p-type semiconductor substrate SUB. Although not shown in FIG. 2, the FMONOS and NMOS are preferably formed in a p-type well region over the main surface of the semiconductor substrate SUB.

The FMONOS is an n-channel memory cell, and the NMOS is an n-channel transistor. The FMONOS has an n-type impurity region NR and a low-concentration n-type impurity region NNR forming a pair of source/drain regions, a gate insulating film GI, and a control gate electrode CG. The multilayer structure formed by the gate insulating film GI and the control gate electrode CG is used as a control gate for selecting the FMONOS memory cell. A multilayer insulating film and a memory gate electrode MG are formed in such a manner that they are adjacent to the control gate electrode CG. The multilayer insulating film is formed by layering a silicon oxide film O1, a silicon nitride film N (nitride insulator layer), and a silicon oxide film O2 in this order. The memory gate electrode MG is in contact with the top surface of the multilayer insulating film. The multilayer structure formed by the multilayer insulating film and the memory gate electrode MG is used as a memory gate for storing data in the FMONOS. The silicon nitride film N included in the multilayer insulating film has the function of storing electric charge as data in the FMONOS.

The multilayer insulating film serving as part of the memory gate is formed in such a manner that the silicon oxide film O1 comes into contact with the main surface of the semiconductor substrate SUB and in such a manner that the silicon nitride film N and the silicon oxide film O2 are layered over the silicon oxide film O1. All of the silicon oxide film O1, the silicon nitride film N, and the silicon oxide film O2 extend from the region interposed between the memory gate electrode MG and the semiconductor substrate SUB and extending along the main surface of the semiconductor substrate SUB to the region interposed between the control gate electrode CG and the memory gate electrode MG and extending in the vertical direction of the drawing.

As seen, the FMONOS includes the control gate and the memory gate. The control gate serves as a transistor for selecting this FMONOS, while the memory gate serves as a memory for storing information in the FMONOS. That is, the FMONOS serves as both a MOS transistor and a non-volatile memory.

In the FMONOS, a side wall silicon oxide film SWI and a side wall silicon nitride film SWN are layered in this order in such a manner that these films contact the outer side wall of the region formed by combining the control gate and the memory gate. The side wall silicon oxide film SWI and the side wall silicon nitride film SWN are formed in a manner to cover the main surface of the semiconductor substrate SUB and the side surfaces of the control gate electrode CG and the memory gate electrode MG.

The NMOS has an n-type impurity region NR and a low-concentration n-type impurity region NNR forming a pair of source/drain regions, a gate insulating film GI, and an n-type gate electrode NG. The n-type gate electrode NG preferably includes polycrystalline silicon containing an n-type impurity.

In the NMOS, a side wall silicon oxide film SWI and a side wall silicon nitride film SWN are layered in this order in such a manner that these films contact the outer side wall of the multilayer structure formed by the gate insulating film GI and the n-type gate electrode NG. The side wall silicon oxide film SWI and the side wall silicon nitride film SWN are formed in a manner to cover both the main surface of the semiconductor substrate SUB and the side surface of the n-type gate electrode NG.

The PMOS has a p-type impurity region PR and a low-concentration p-type impurity region PPR forming a pair of source/drain regions, a gate insulating film GI, and a p-type gate electrode PG. The p-type gate electrode PG preferably includes polycrystalline silicon containing a p-type impurity.

In the PMOS, a side wall silicon oxide film SWI is formed in a manner to contact the outer side wall of the multilayer structure formed by the gate insulating film GI and the p-type gate electrode PG. The side wall silicon oxide film SWI is formed in a manner to cover both the main surface of the semiconductor substrate SUB and the side surface of the p-type gate electrode PG.

In any of the FMONOS, NMOS, and PMOS, a region that is adjacent to the main surface of the semiconductor substrate SUB and directly below the gate insulating film GI is a channel region where a channel is formed due to a field effect. Nitride films (e.g., silicon nitride films) are formed in a manner to contact the top surfaces of the FMONOS, NMOS, or PMOS. Specifically, a nitride film CS1 is formed in a manner to contact the top surfaces of the FMONOS and the NMOS, and a nitride film CS2 is formed in a manner to contact the top surface of the PMOS.

More specifically, the nitride film CS1 is formed in a manner to contact the top surfaces of the gate electrodes of the FMONOS and the NMOS, the top surfaces of the n-type impurity regions NR, the top surfaces of the side wall silicon oxide films SWI, and the top and side surfaces of the side wall silicon nitride films SWN. The nitride film CS1 is also formed in a manner to cover the region between the FMONOS and the NMOS over the top surface of the semiconductor substrate SUB. The nitride film CS2 is formed in a manner to contact the top surface of the gate electrode of the PMOS, the top surface of the p-type impurity region PR, the top surface of the side wall silicon oxide film SWI, and the top and side surfaces of the side wall silicon nitride film SWN.

The nitride films CS1 and CS2 are each a so-called contact etch stopper film that applies stress to the channel regions of the FMONOS and the NMOS or the channel region of the PMOS by SPT. Specifically, the nitride film CS1 applies tensile stress to the channel regions of the FMONOS and the NMOS, while the nitride film CS2 applies compressive stress to the channel region of the PMOS. Both the tensile stress and compressive stress applied by the nitride films CS1 and CS2 are preferably 1 GPa or more. Whether the nitride film CS1 or the nitride film CS2 is applying tensile stress or compressive stress, and the magnitude and direction of such stress can be determined by Raman microspectroscopy. An insulating film SII having high etch selectivity with respect to the nitride films CS1 and CS2 is formed in a manner to contact the top surface of the nitride film CS1.

In all of the FMONOS, the NMOS, and the PMOS, silicide SC is preferably formed over the top surfaces of the source/drain regions and the top surface of the gate electrode. The silicide SC is formed when silicon reacts with, for example, cobalt (CO) or nickel (NI) in the region extending from the surface having the silicon exposed thereon, such as the surface of the n-type impurity region NR or the surface of the gate electrode, by a given depth in the direction perpendicular to the surface.

Next, a method for manufacturing the semiconductor device according to this embodiment shown in FIG. 2 will be described with reference to FIGS. 3 to 16.

Figure 3:
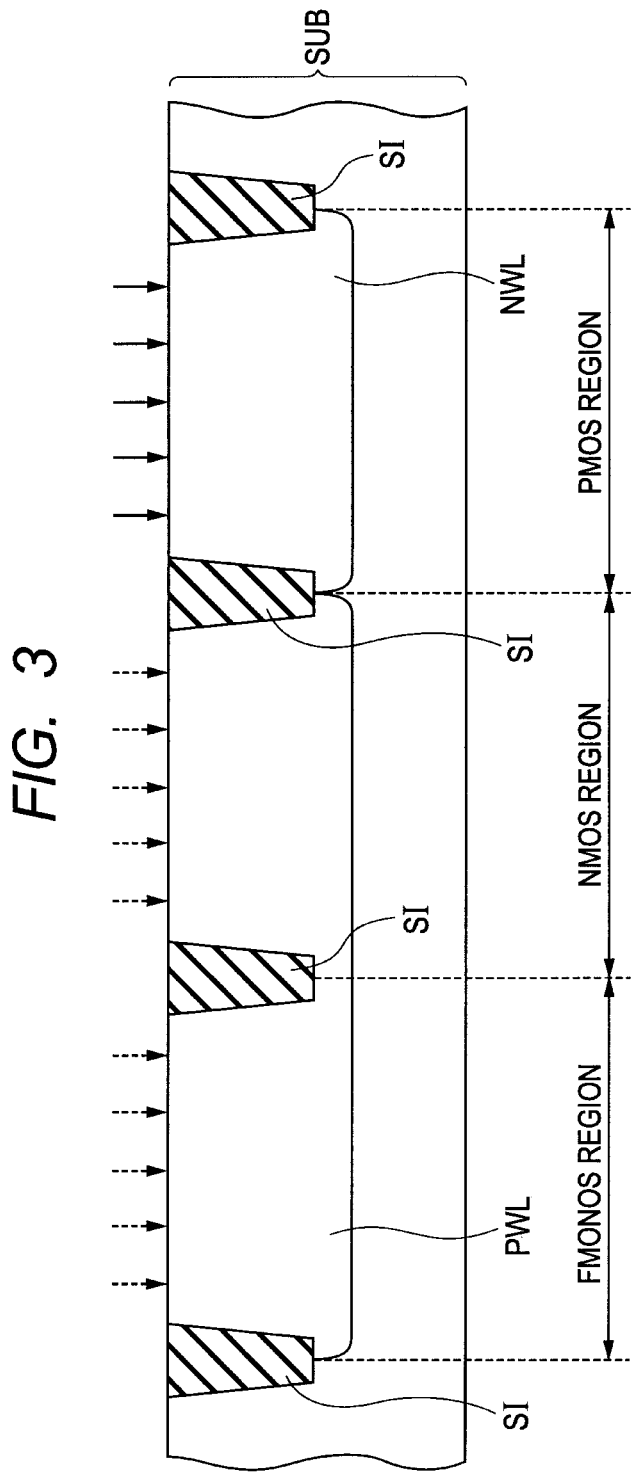
FIG. 3 is a schematic sectional view showing a first step of a method for manufacturing the semiconductor device having the configurations shown in FIG. 2.

Referring to FIG. 3, first, a semiconductor substrate SUB including silicon monolayer containing a p-type impurity, for example, is prepared. Then, a trench isolation structure SI for dividing the main surface of the semiconductor substrate SUB into an FMONOS region, an NMOS region, and a PMOS region is formed.

Then, although not shown specifically, a pad oxide film composed of, e.g., a silicon oxide film, and a silicon nitride film are sequentially formed over one (top) main surface of the semiconductor substrate SUB. Subsequently, the pad oxide film, the silicon nitride film, and the semiconductor substrate SUB are partially eliminated by ordinary photoengraving and etching in the region where the trench isolation structure SI is formed. By this process, trenches are formed on part of the semiconductor substrate SUB in the region where the trench isolation structure SI is to be formed.

Subsequently, a silicon oxide film is deposited by, for example, chemical vapor deposition (CVD) in a manner to cover the main surface of the semiconductor substrate SUB and the trenches. By filling the trenches with this silicon oxide film, the trench isolation structure SI is formed. After forming the trench isolation structure SI, the silicon nitride film and the silicon oxide film are eliminated by, e.g., wet etching while leaving the pad oxide film on the main surface of the semiconductor substrate SUB.

Subsequently, patterning is performed by ordinary photoengraving. Specifically, a pattern of a resist film having an aperture is formed in a region where it is desired to form a well to serve as an impurity region. Using the resist film as a mask, ions of a p-type impurity such as boron (B) are implanted into the region where a p-type well region PWL is to be formed (FMONOS region and NMOS region), within the semiconductor substrate SUB by ordinary implantation technique. Similarly, ions of an n-type impurity such as arsenic (As) or phosphorus (P) are implanted into the region where an n-type well region NWL is to be formed (PMOS region), within the semiconductor substrate SUB.

In the first stage, a p-type impurity such as boron is preferably implanted with energy of several keV or more and several hundred keV or less and, more specifically, 10 keV or more and 500 keV or less and with a density of $1 \times 10^{11}$ cm$^{-2}$ or more and $5 \times 10^{13}$ cm$^{-2}$ or less in a plan view. Subsequently, in the second stage, an n-type impurity such as arsenic or phosphorus is preferably implanted with energy of several keV or more and several hundred keV or less and, more specifically, 10 keV or more and 500 keV or less and with a density of $1 \times 10^{11}$ cm$^{-2}$ or more and $5 \times 10^{13}$ cm$^{-2}$ or less in a plan view.

With regard to the NMOS and PMOS regions, after forming the p-type well region PWL and the n-type well region NWL, impurity ions may additionally be implanted by implantation technique (channel implantation) as described above.

In FIG. 3, the implantation of the p-type impurity is shown by dotted arrows, and the implantation of the n-type impurity is shown by solid arrows. While the p-type impurity and the n-type impurity are actually implanted at different timings as described above, the implantation of these impurities is shown collectively in FIG. 3. Note that in FIG. 4 and later, the p-type well region PWL will not be shown.

Figure 4:
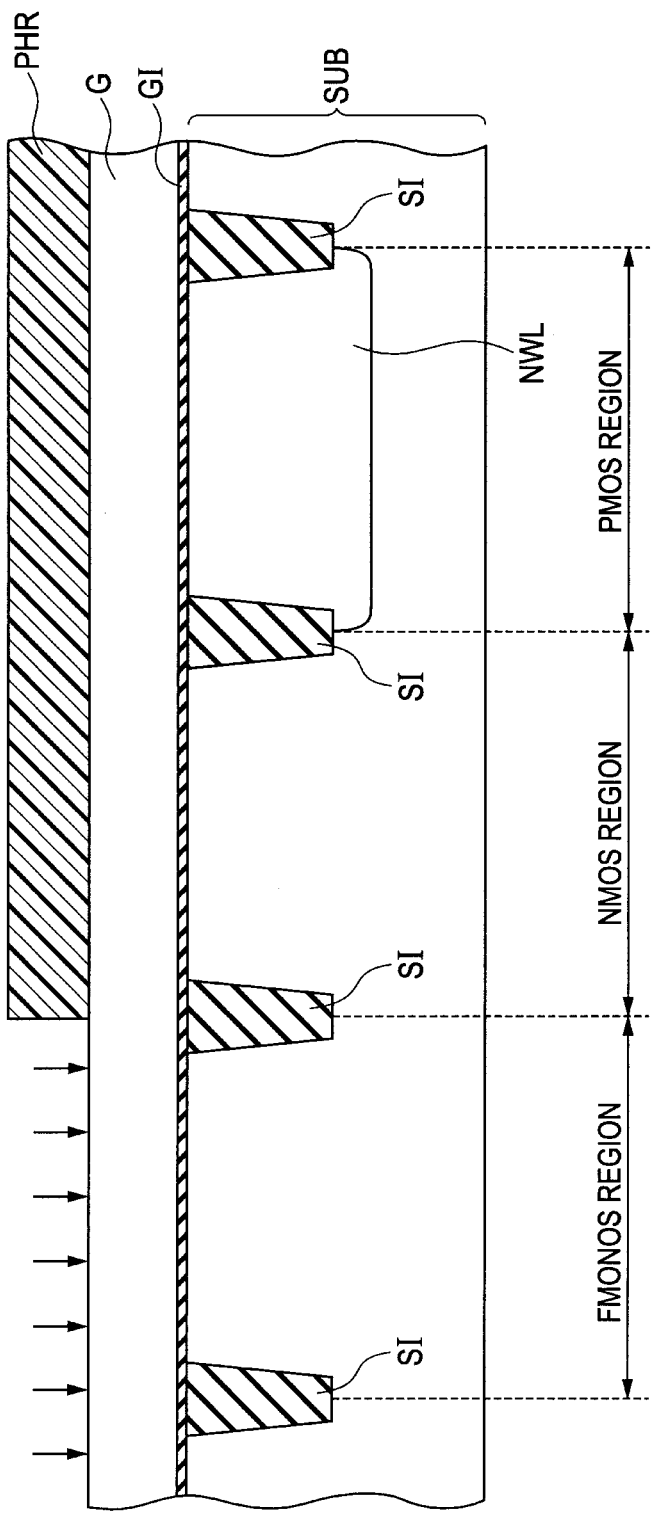
FIG. 4 is a schematic sectional view showing a second step of the method for manufacturing the semiconductor device having the configurations shown in FIG. 2.

Referring to FIG. 4, the pad oxide film is eliminated and then a gate insulating film GI is formed in a manner to cover the main surface of the semiconductor substrate SUB and the top surface of the trench isolation structure SI by, e.g., thermal oxidation. The thickness of the gate insulating film GI is preferably 0.5 nm or more and 15 nm or less. Subsequently, a thin layer of polycrystalline silicon G is formed over the gate insulating film GI by, e.g., CVD. The thickness of the polycrystalline silicon G is preferably 10 nm or more and 300 nm or less.

Subsequently, a resist pattern PHR having an aperture in the FMONOS region is formed and then ions of an n-type impurity such as arsenic or phosphorous are implanted into the polycrystalline silicon G in the FMONOS region by ordinary photoengraving.

Figure 5:
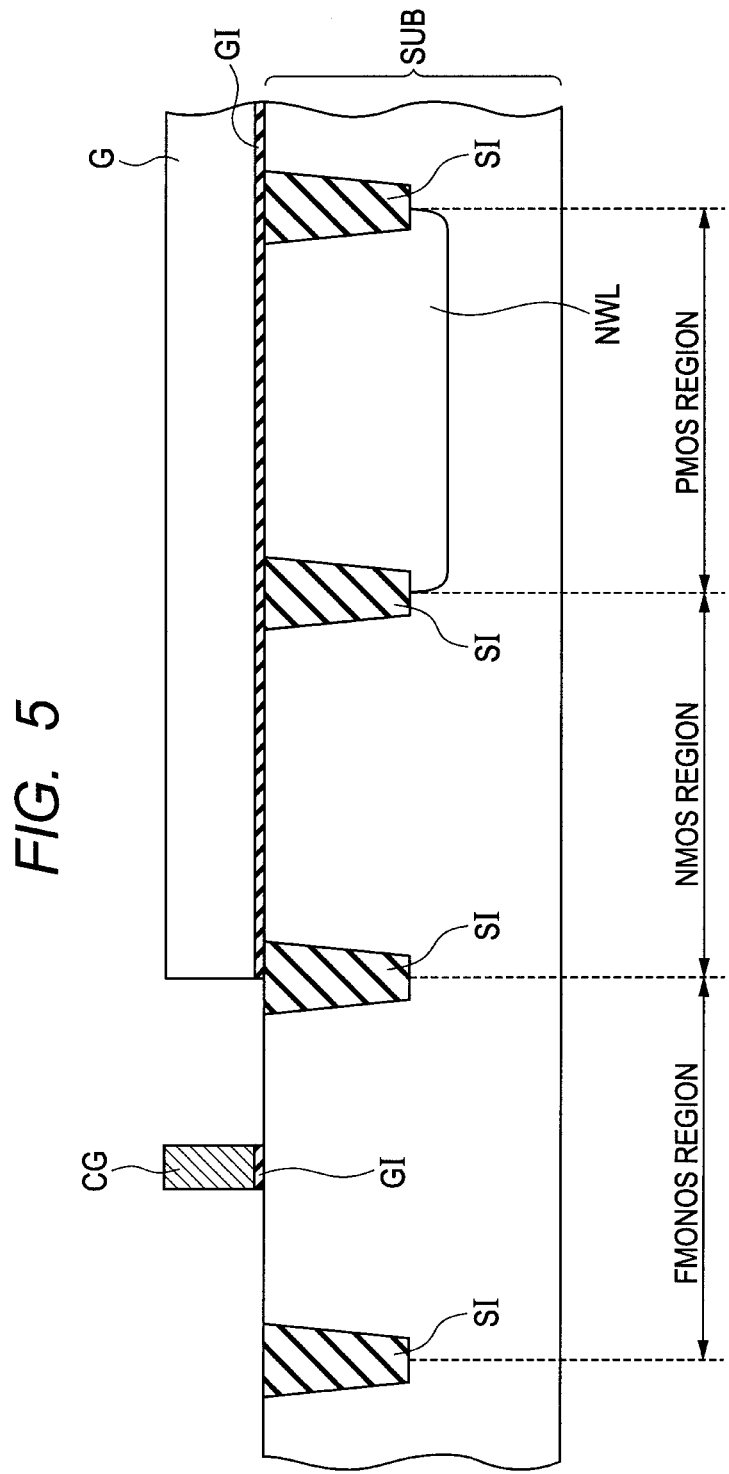
FIG. 5 is a schematic sectional view showing a third step of the method for manufacturing the semiconductor device having the configurations shown in FIG. 2.

Referring to FIG. 5, the polycrystalline silicon G and the gate insulating film GI in the FMONOS region are patterned by ordinary photoengraving and etching. This forms a control gate electrode CG of the FMONOS and a gate insulating film GI contacting the bottom surface of the control gate electrode CG.

Figure 6:
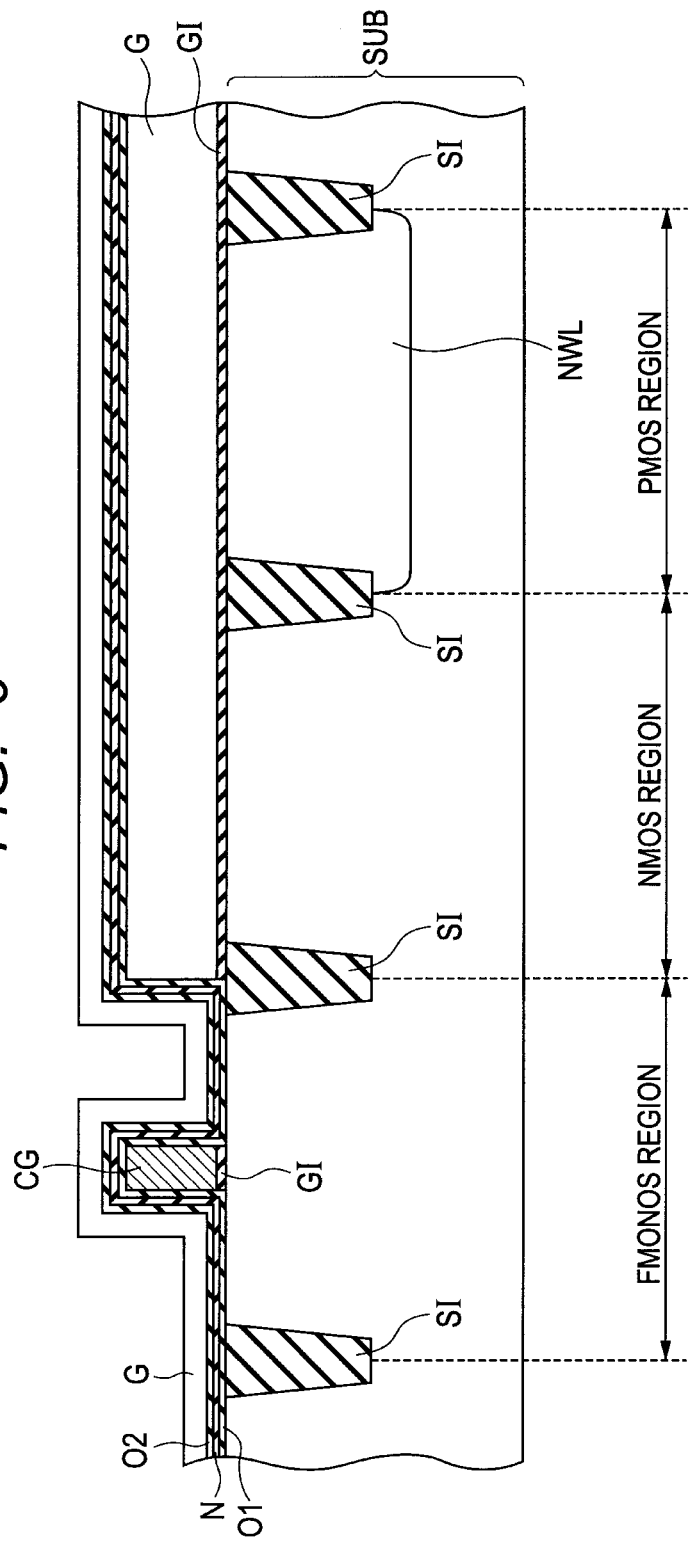
FIG. 6 is a schematic sectional view showing a fourth step of the method for manufacturing the semiconductor device having the configurations shown in FIG. 2.

Referring to FIG. 6, a silicon oxide film O1, a silicon nitride film N, and a silicon oxide film O2 for forming a multilayer insulating film of the FMONOS are formed in this order in a manner to cover the semiconductor substrate SUB, the control gate electrode CG, and the polycrystalline silicon G. Specifically, a silicon oxide film O1 having a thickness of 1 nm or more and 10 nm or less is formed by, e.g., thermal oxidation and then a silicon nitride film N having a thickness of 1 nm or more and 10 nm or less is formed by CVD in a manner to contact the top surface of the silicon oxide film O1. Subsequently, a silicon oxide film O2 having a thickness of 1 nm or more and 10 nm or less is formed by, e.g., CVD in a manner to contact the top surface of the silicon nitride film N. Further, a thin layer of polycrystalline silicon G having a thickness of 10 nm or more and 100 nm or less is formed by, e.g., CVD in a manner to contact the top surface of the silicon oxide film O2.

Figure 7:
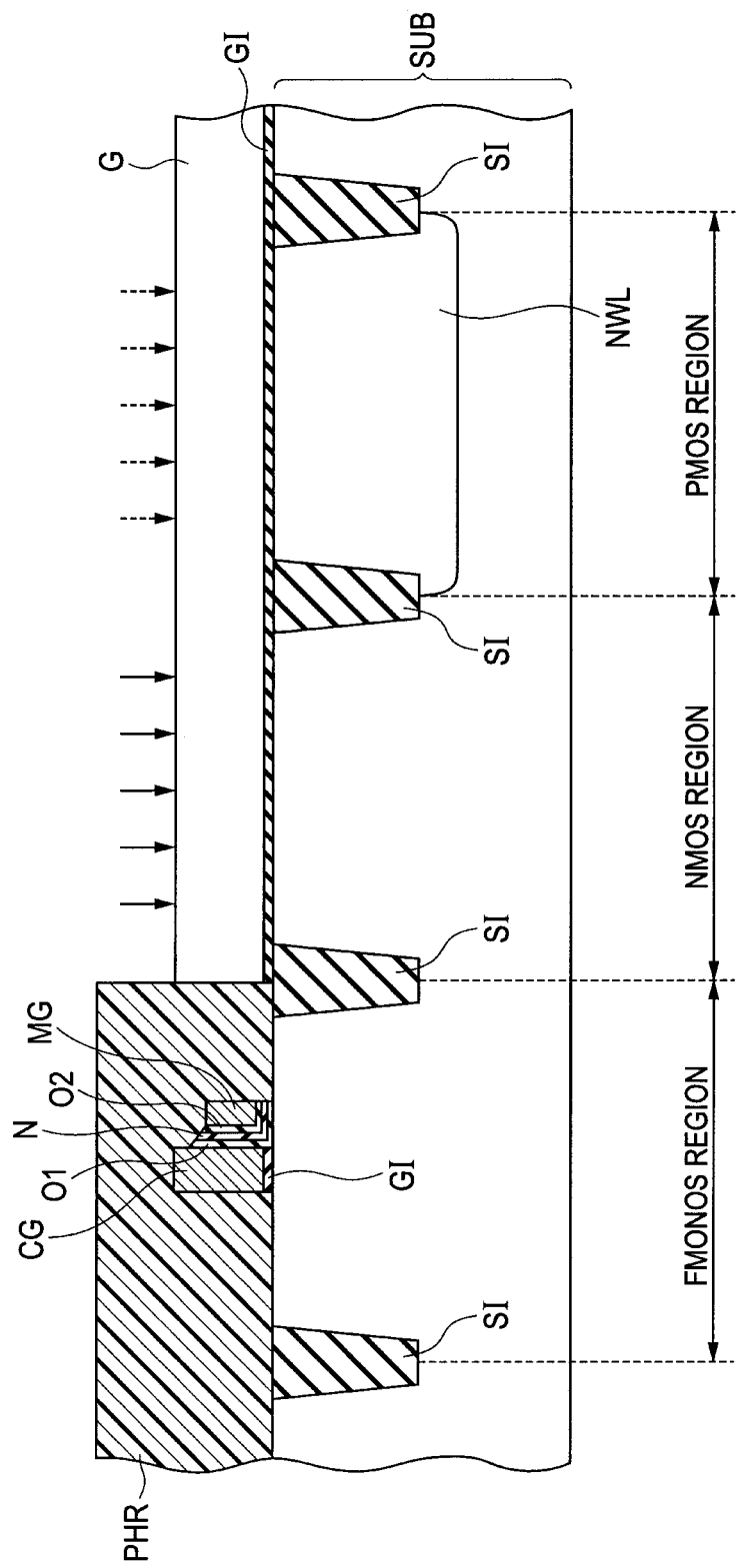
FIG. 7 is a schematic sectional view showing a fifth step of the method for manufacturing the semiconductor device having the configurations shown in FIG. 2.

Referring to FIG. 7, the silicon oxide film O1, the silicon nitride film N, and the silicon oxide film O2 formed in the FMONOS region as the multilayer insulating film in the step of FIG. 6 and the polycrystalline silicon G formed in the same step are formed into a pattern of a memory gate electrode MG by ordinary photoengraving and etching. The memory gate of the FMONOS is formed in this way.

Subsequently, a resist pattern PHR having an aperture in the NMOS and PNOS regions is formed. Subsequently, by ordinary photoengraving, ions of an n-type impurity such as arsenic or phosphorous are implanted into the polycrystalline silicon G in the NMOS region, and ions of a p-type impurity such as boron are implanted into the polycrystalline silicon G in the PMOS region.

Figure 8:
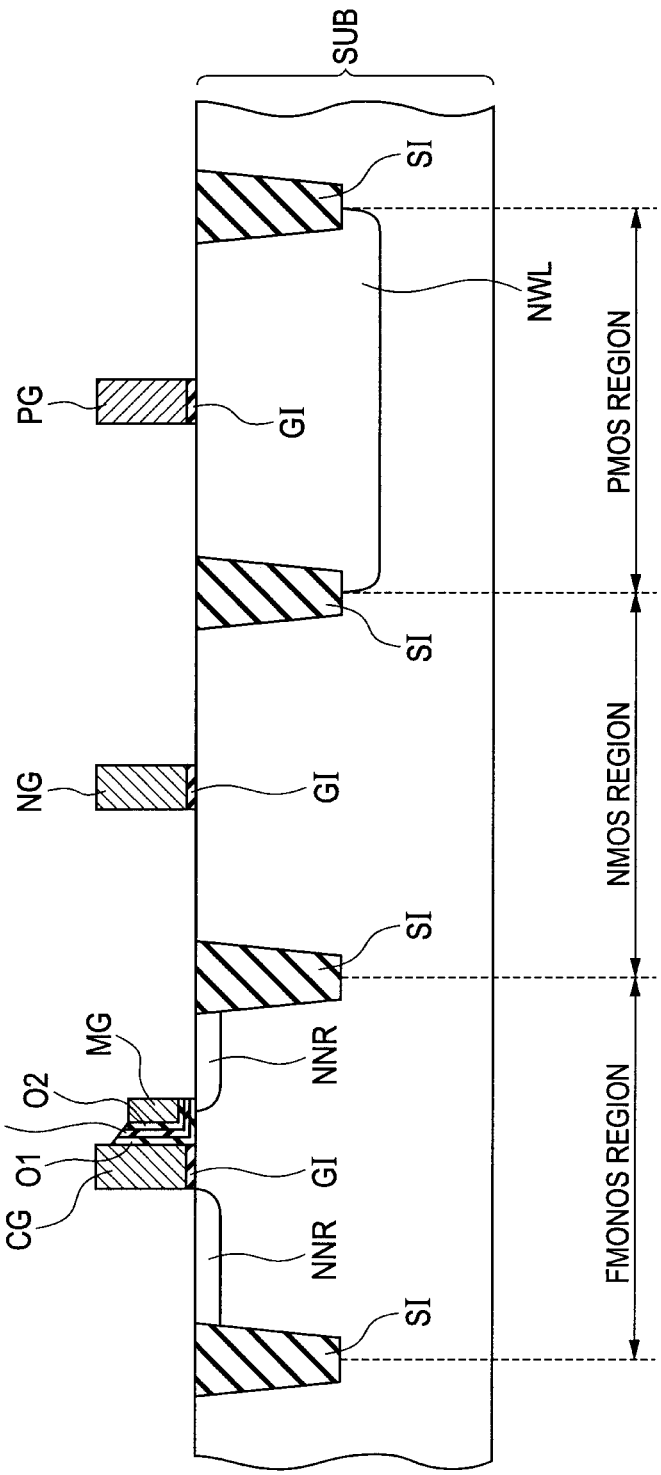
FIG. 8 is a schematic sectional view showing a sixth step of the method for manufacturing the semiconductor device having the configurations shown in FIG. 2.

Referring to FIG. 8, the polycrystalline silicon G and the gate insulating film GI in the NMOS and PMOS regions are first patterned by ordinary photoengraving and etching. This forms an n-type gate electrode NG and a gate insulating film GI included in the NMOS, and a p-type gate electrode PG and a gate insulating film GI included in the PMOS.

Then, a low-concentration n-type impurity region NNR for forming parts of source/drain regions is formed in the FMONOS region over the main surface of the semiconductor substrate SUB by ordinary implantation technique. At this time, ions of an n-type impurity such as arsenic is preferably implanted with energy of several keV or more and several tens of keV or less and, more specifically, 1 keV or more and 50 keV or less and with a density of $1\times10^{13}$ cm$^{-2}$ or more and $5\times10^{15}$ cm$^{-2}$ or less in a plan view.

Figure 9:
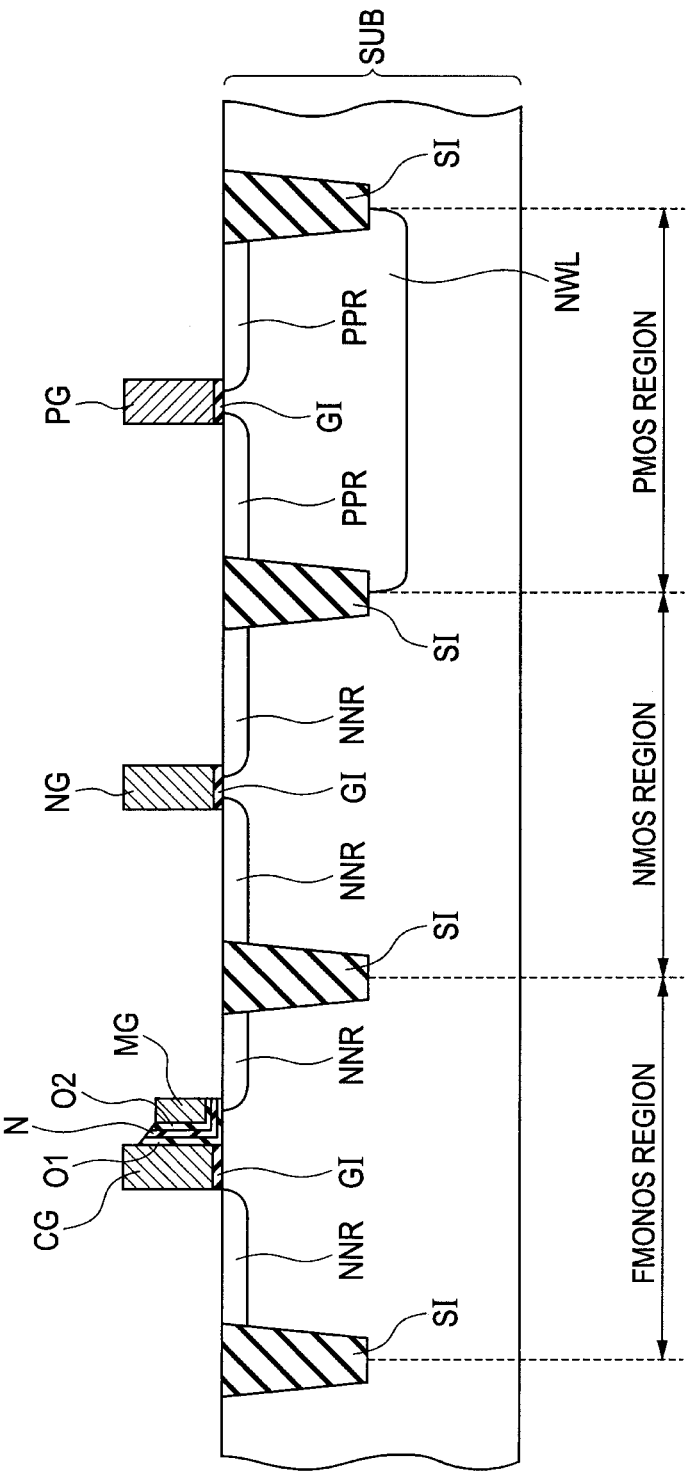
FIG. 9 is a schematic sectional view showing a seventh step of the method for manufacturing the semiconductor device having the configurations shown in FIG. 2.

Referring to FIG. 9, a low-concentration n-type impurity region NNR for forming parts of source/drain regions is formed in the NMOS region over the main surface of the semiconductor substrate SUB by ordinary implantation technique. At this time, ions of an n-type impurity such as arsenic are preferably implanted with energy of several keV or more and several tens of keV or less and, more specifically, 1 keV or more and 50 keV or less and with a density of $1\times10^{14}$ cm$^{-2}$ or more and $5\times10^{14}$ cm$^{-2}$ or less in a plan view. Similarly, a low-concentration p-type impurity region PPR for forming source/drain regions is formed in the PMOS region over the main surface of the semiconductor substrate SUB. At this time, ions of a p-type impurity such as boron difluoride (BF$_2$) is preferably implanted with energy of several keV or more and several tens of keV or less and, more specifically, 1 keV or more and 50 keV or less and with a density of $1\times10^{14}$ cm$^{-2}$ or more and $5\times10^{14}$ cm$^{-2}$ or less in a plan view.

Figure 10:
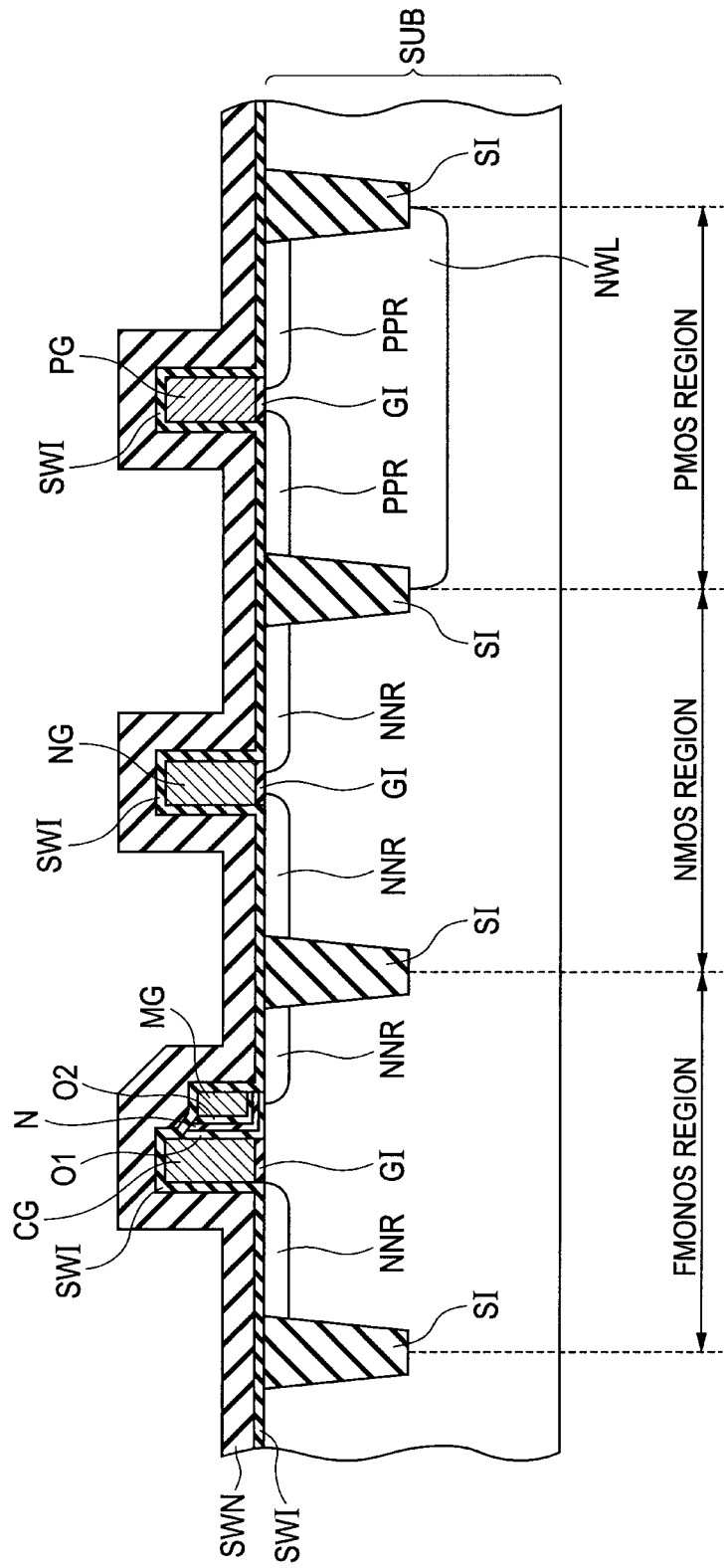
FIG. 10 is a schematic sectional view showing an eighth step of the method for manufacturing the semiconductor device having the configurations shown in FIG. 2.

Referring to FIG. 10, a silicon oxide film for forming a side wall silicon oxide film SWI and a silicon nitride film for forming a side wall silicon nitride film SWN are layered in this order over the main surface of the semiconductor substrate SUB in a manner to cover the side wall surfaces and the top surfaces of the multilayer structures of the gate electrodes formed in the FMONOS, NMOS, and PMOS regions. Specifically, a silicon oxide film for forming a side wall silicon oxide film SWI is formed with a thickness of 1 nm or more and 10 nm or less and then a silicon nitride film for forming a side wall silicon nitride film SWN is formed with a thickness of 5 nm and more and 50 nm or less.

Figure 11:
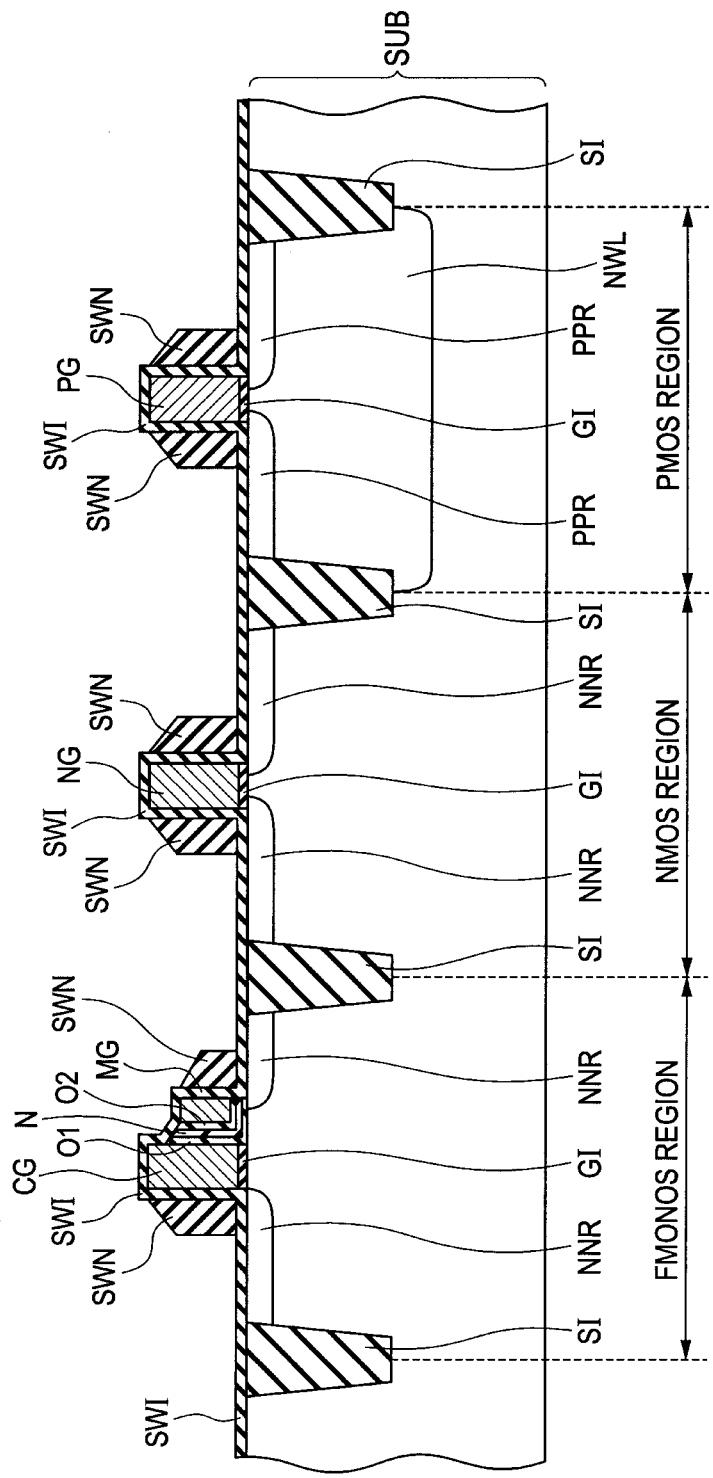
FIG. 11 is a schematic sectional view showing a ninth step of the method for manufacturing the semiconductor device having the configurations shown in FIG. 2.

Referring to FIG. 11, the silicon oxide film and silicon nitride film formed in the step of FIG. 10 are patterned into a side wall silicon oxide film SWI and a side wall silicon nitride film SWN by ordinary photoengraving and etching.

Figure 12:
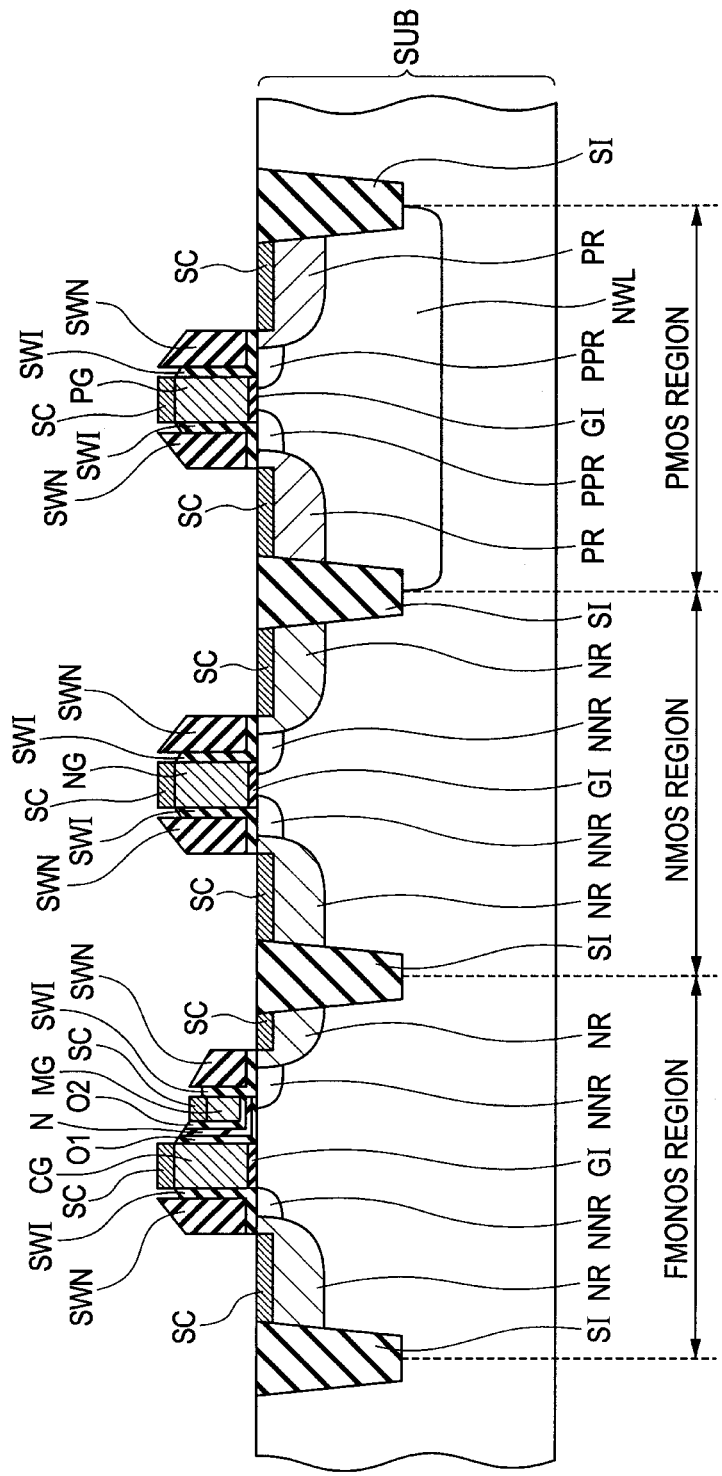
FIG. 12 is a schematic sectional view showing a tenth step of the method for manufacturing the semiconductor device having the configurations shown in FIG. 2.

Referring to FIG. 12, an n-type impurity region NR for forming parts of source/drain regions is formed in the FMONOS and NMOS regions over the main surface of the semiconductor substrate SUB by ordinary implantation technique. At this time, ions of an n-type impurity such as arsenic are preferably implanted with energy of several tens of keV and, more specifically, 10 keV or more and 50 keV or less and with a density of $1\times10^{15}$ cm$^{-2}$ or more and $5\times10^{15}$ cm$^{-2}$ or less in a plan view. Further, a p-type impurity region PR for forming parts of source/drain regions is formed in the PMOS region over the main surface of the semiconductor substrate SUB by ordinary photoengraving. For example, molecules of an n-type impurity such as boron difluoride are preferably implanted with energy of several tens of keV and, more specifically, 10 keV or more and 50 keV or less and with a density of $1\times10^{15}$ cm$^{-2}$ or more and $5\times10^{15}$ cm$^{-2}$ or less in a plan view.

Subsequently, silicide SC is formed over the top surfaces of the gate electrodes CG, MG, NG, and PG and the top surfaces of the n-type impurity region NR and the p-type impurity region PR. Specifically, a metal film (now shown) is formed in a manner to cover the top surfaces of the regions shown in FIG. 12. This metal film is formed by allowing, e.g., cobalt (Co) to be deposited with a thickness of several nm or more and several tens of nm or less. Instead of cobalt, nickel (Ni), for example, may be formed. Such a metal film multilayer structure is preferably formed using an ordinary metal thin film formation method such as sputtering.

Subsequently, so-called annealing is performed. Specifically, the semiconductor substrate SUB is heated at a temperature of several hundred ° C. for several tens of seconds to several minutes. Thus, silicon atoms included in the n-type impurity region NR and the like and cobalt atoms or nickel atoms formed thereon react with each other to form silicide SC. Subsequently, the metal film that has not been converted into silicide is eliminated by, e.g., wet etching.

Figure 13:
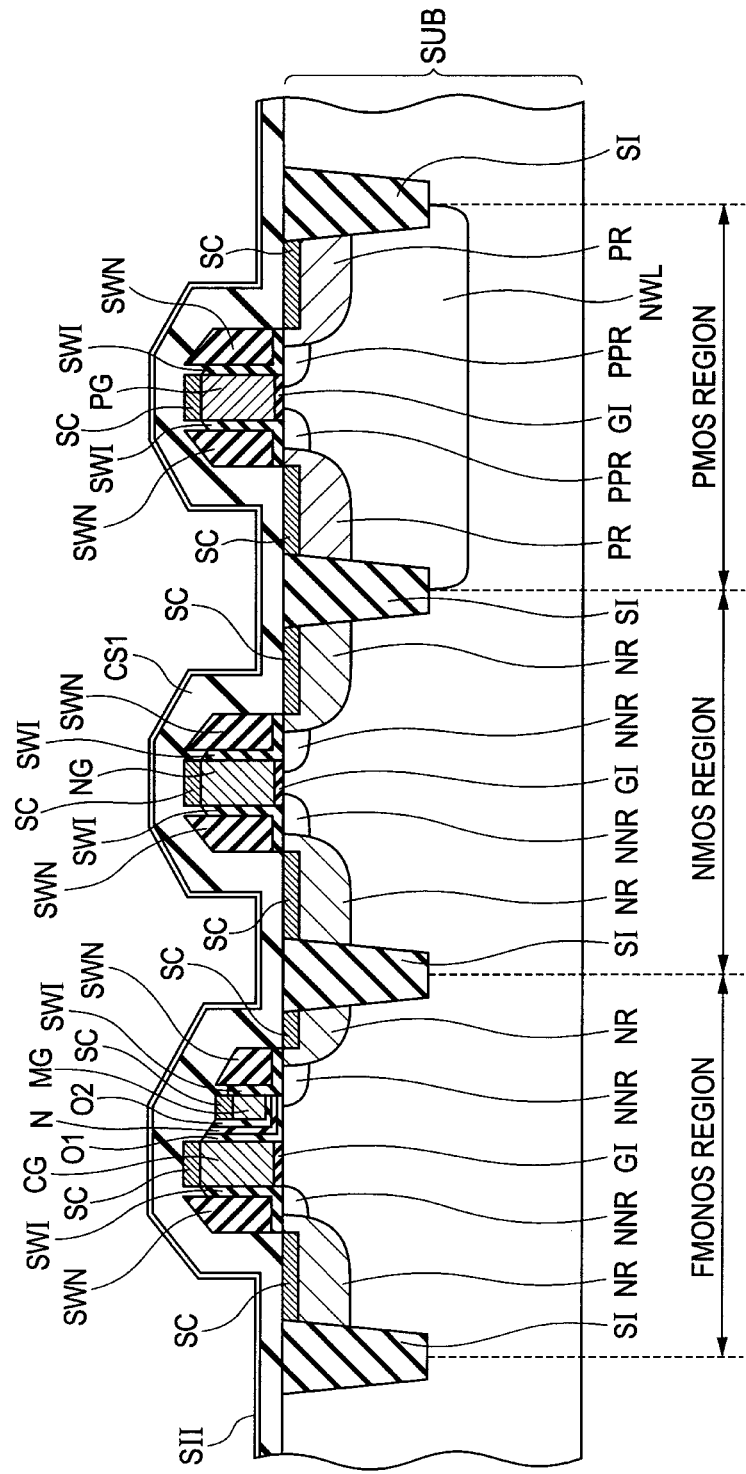
FIG. 13 is a schematic sectional view showing an eleventh step of the method for manufacturing the semiconductor device having the configurations shown in FIG. 2.

Referring to FIG. 13, a nitride film CS1 is formed over the main surface of the semiconductor substrate SUB in a manner to cover the FMONOS, NMOS, and PMOS regions. The nitride film CS1 is formed by CVD in a manner to contact the top surfaces of the FMONOS, NMOS, and PMOS regions. The nitride film CS1 has tensile stress and is formed in a manner to apply tensile stress to the channel regions of the FMONOS and NMOS to be formed. The thickness of the nitride film CS1 is preferably 10 nm or more and 100 nm or less.

Subsequently, an insulating film SII made of a material having high etch selectivity with respect to the nitride film CS1 and a nitride film CS2 is formed in a manner to cover the nitride film CS1. The insulating film SII is, for example, a thin layer of tetraethoxysilane (TEOS) having a thickness of 2 nm or more and 10 nm or less and formed by, e.g., CVD. Instead of a thin layer of TEOS, the insulating film SII may be a silicon oxide film having a thickness as described above and formed by CVD.

Figure 14:
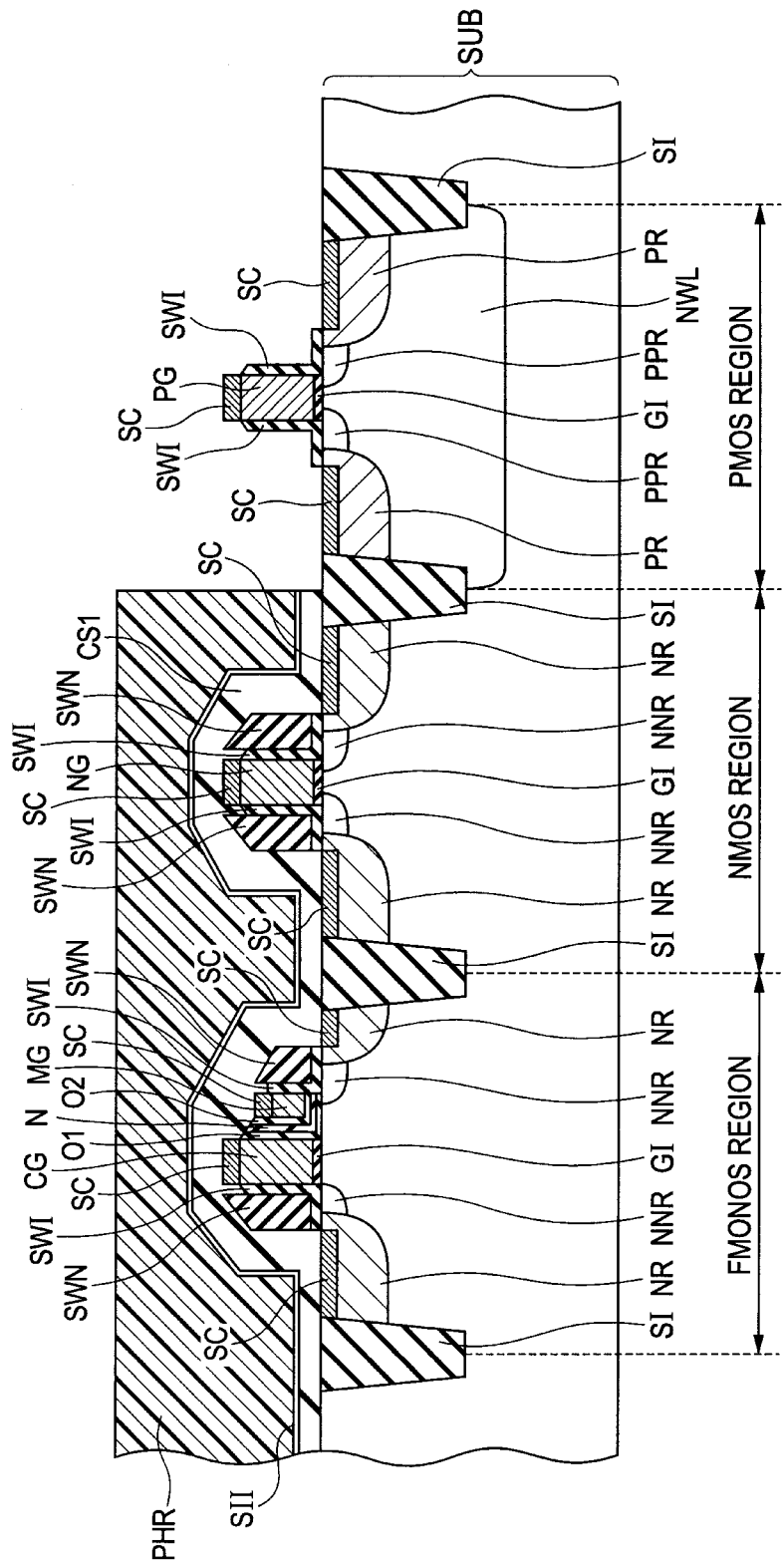
FIG. 14 is a schematic sectional view showing a twelfth step of the method for manufacturing the semiconductor device having the configurations shown in FIG. 2.

Referring to FIG. 14, first, patterning is performed by ordinary photoengraving. Specifically, a resist pattern PHR (protective film) having an aperture in the PMOS region (covering the top surfaces of the FMONOS and NMOS regions) is formed. Using the resist pattern PHR as a mask, the insulating film SII, the nitride film CS1, and the side wall silicon nitride film SWN in the PMOS region are eliminated by ordinary etching. That is, the side wall silicon nitride film SWN in the PMOS region is eliminated in a state where the nitride film CS1, the insulating film SII, and the resist pattern PHR serving as a protective film are covering the top surface of the silicon nitride film N in the FMONOS region. Accordingly, the side wall silicon nitride film SWN in the FMONOS region and the NMOS region is maintained.

The elimination of the side wall silicon nitride film SWN in the PMOS region allows a reduction in the distance between a nitride film CS2 to be formed later and intended to apply compressive stress to the channel region of the PMOS, and that channel region. Thus, the nitride film CS2 can more efficiently apply compressive stress to the channel region of the PMOS.

Figure 15:
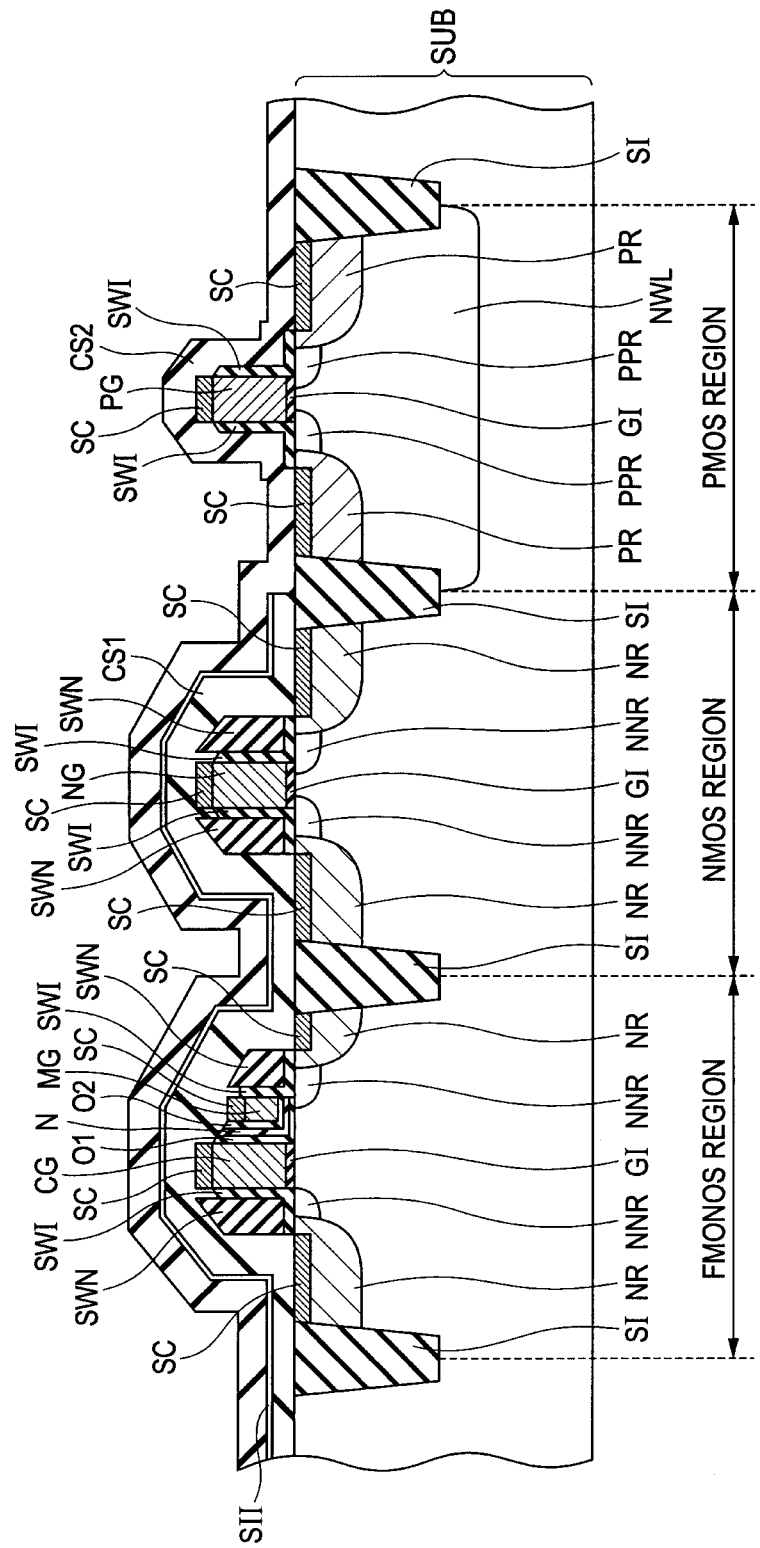
FIG. 15 is a schematic sectional view showing a thirteenth step of the method for manufacturing the semiconductor device having the configurations shown in FIG. 2.

Referring to FIG. 15, the resist pattern PHR formed in the step of FIG. 14 is eliminated and then a nitride film CS2 is formed over the main surface of the semiconductor substrate SUB in a manner to cover the FMONOS, NMOS, and PMOS regions. The nitride film CS2 is formed by CVD in a manner to contact the top surfaces of the FMONOS, NMOS, and PMOS regions. The nitride film CS2 has compressive stress and is formed in a manner to apply compressive stress to the channel region of the PMOS to be formed. The thickness of the nitride film CS2 is preferably 10 nm or more and 100 nm or less.

Figure 16:
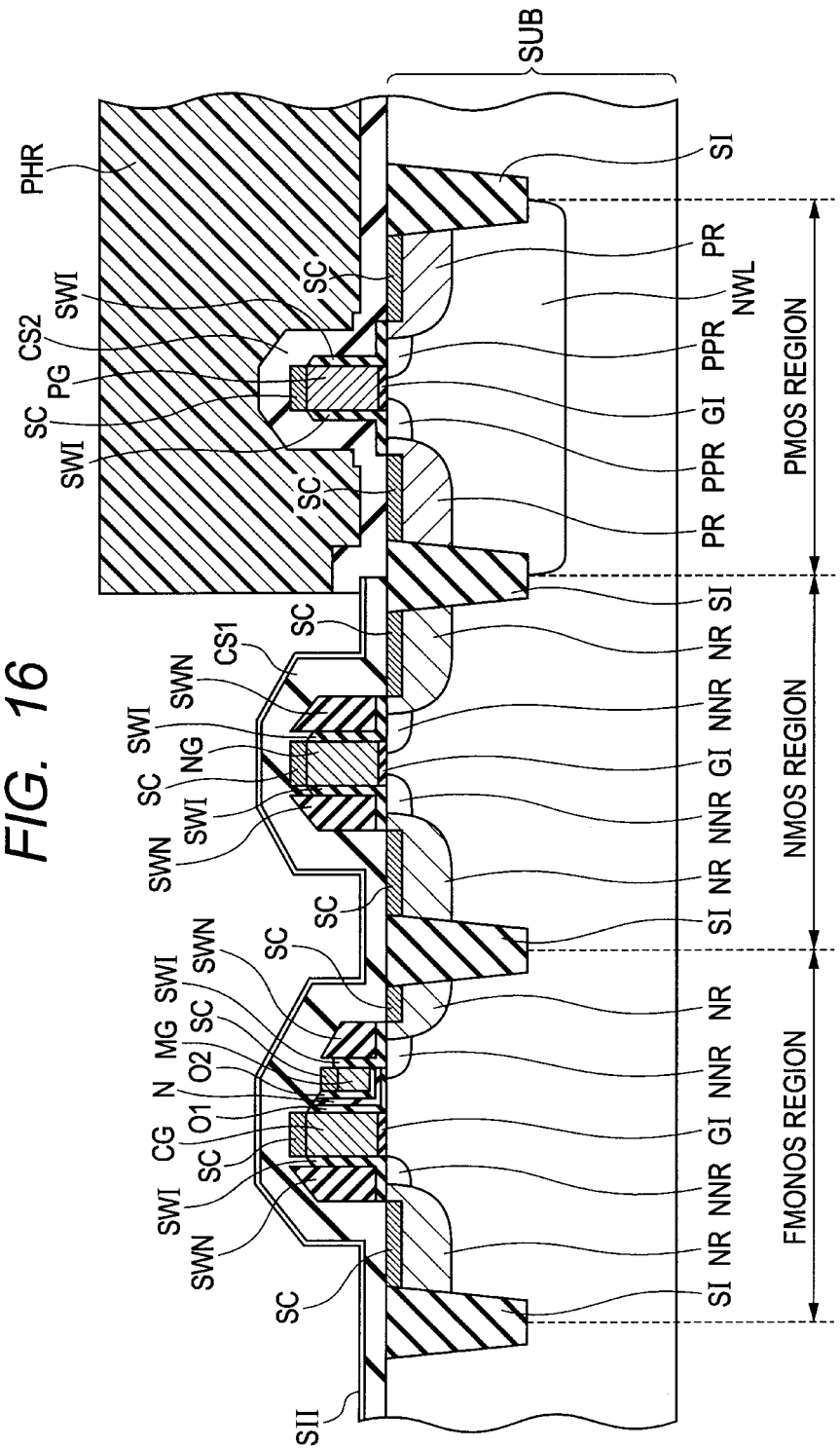
FIG. 16 is a schematic sectional view showing a fourteenth step of the method for manufacturing the semiconductor device having the configurations shown in FIG. 2.

Referring to FIG. 16, first, pattering is performed by ordinary photoengraving. Specifically, a resist pattern PHR having an aperture in the FMONOS and NNOS regions is formed. Using the resist pattern PHR as a mask, the nitride film CS2 in the FMONOS and NMOS regions are eliminated by ordinary etching. As a result, the nitride film CS2 remains in the PMOS region.

Since the insulating film SII has high etch selectivity with respect to a nitride film, it serves, in this process, as a stopper for preventing etching of the nitride film CS1 contacting the bottom surface thereof in the FMONOS and NMOS regions. As a result, the nitride film CS1 and insulating film SII remain in the FMONOS and NMOS regions.

Subsequently, the resist pattern PHR is eliminated. Thus, a semiconductor device as shown in FIG. 2 is formed where the nitride film CS1 for applying tensile stress to the channels of the FMONOS and NMOS is formed in a manner to contact the top surfaces of the FMONOS and NMOS and where the nitride film CS2 for applying compressive stress to the channel of the PMOS is formed in a manner to contact the top surface of the PMOS.

Next, advantages of this embodiment will be described with reference to FIGS. 17 to 18, which show a manufacturing method according to a comparative example to this embodiment.

Figure 17:
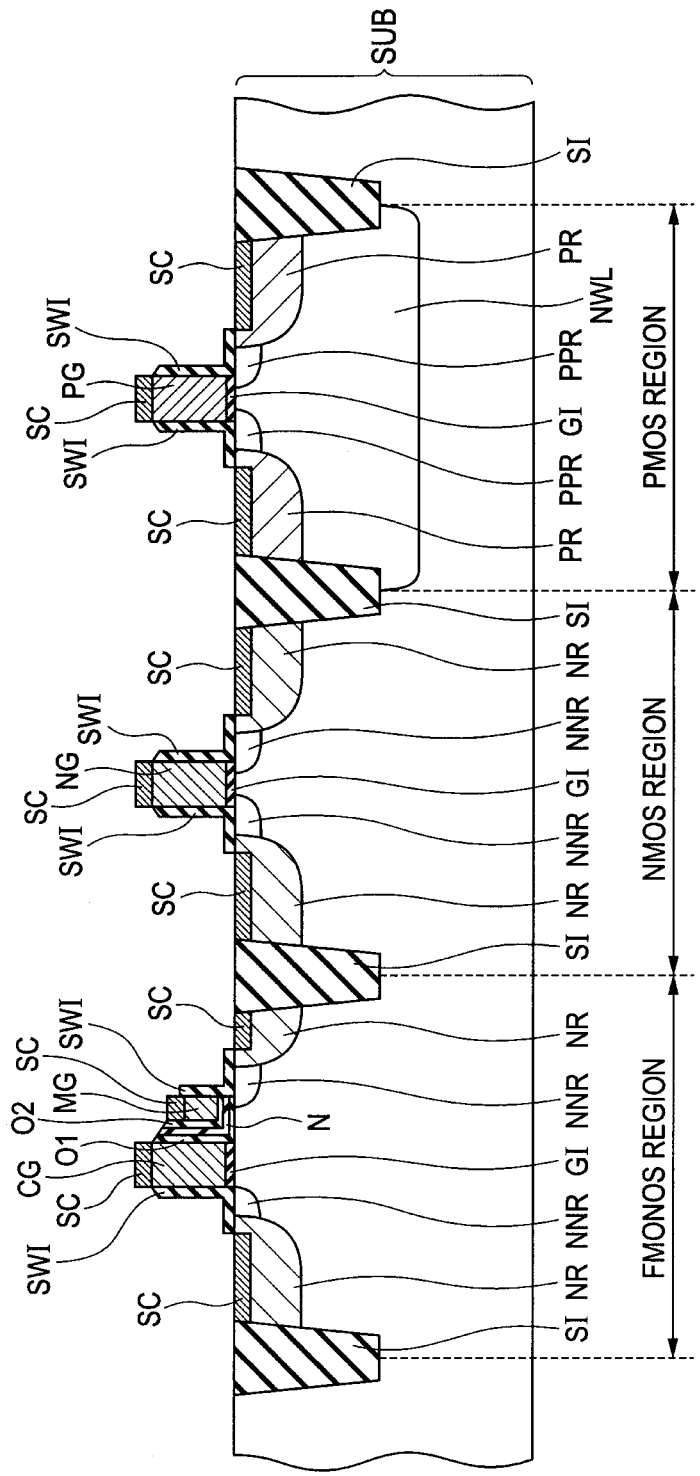
FIG. 17 is a schematic sectional view showing a step following FIG. 12 in a method for manufacturing a semiconductor device according to a comparative example to the present invention.
Figure 18:
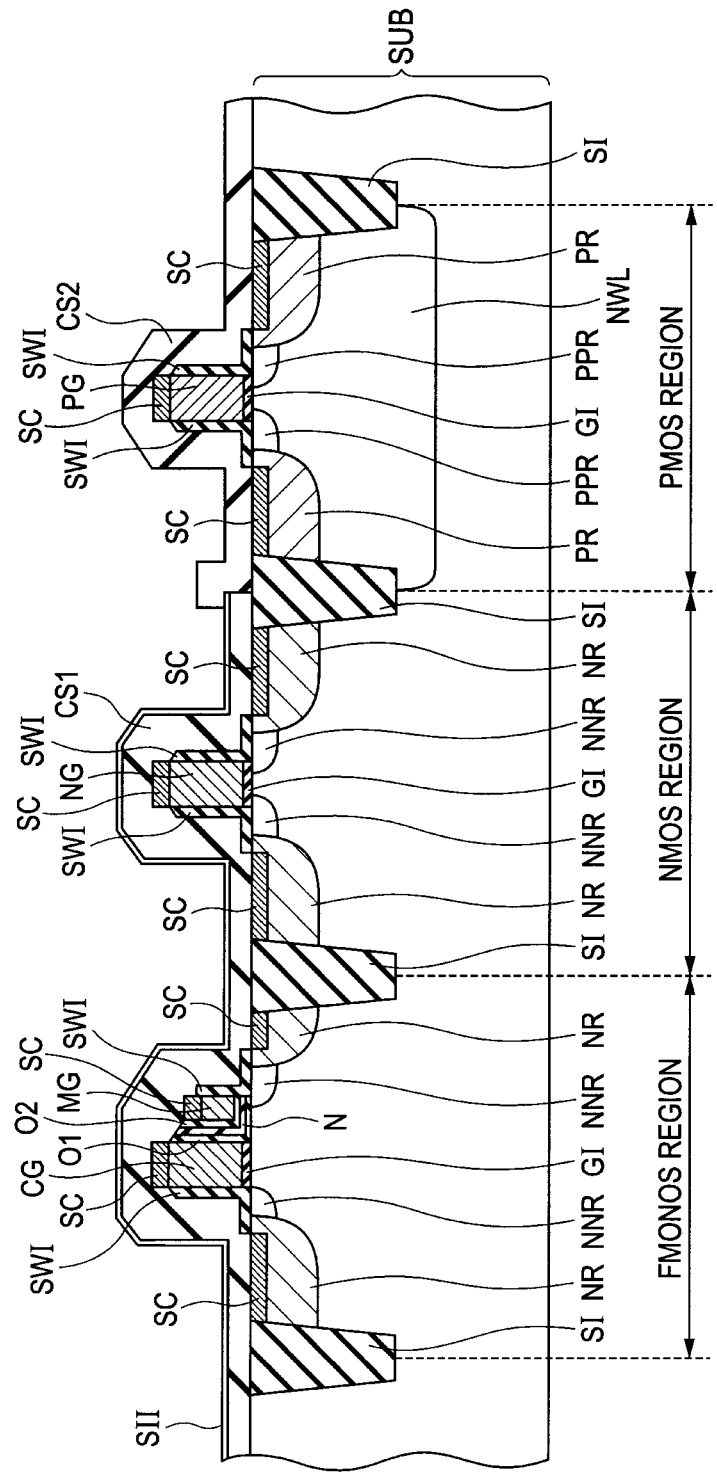
FIG. 18 is a schematic sectional view showing the configurations of a MONOS-type memory cell, an n-channel transistor, and a p-channel transistor similar to those in FIG. 2 in the semiconductor device according to the comparative example to the present invention.

Referring to FIG. 17, in a method for manufacturing a semiconductor device according to a comparative example to this embodiment where the semiconductor device includes an FMONOS, an NMOS, and a PMOS as in FIG. 2, all the side wall silicon nitride films SWN in the FMONOS, NMOS, and PMOS regions are eliminated by, e.g., ordinary etching after the steps of FIGS. 3 to 12. At this time, the silicon nitride film N included in the memory gate of the FMONOS and intended to store electric charge may be eliminated from above along with the side wall silicon nitride film SWN. The reason is that the etch selectivity between the side wall silicon nitride film SWN and the silicon nitride film N is low. Thus, a state occurs in which the silicon nitride film N between the silicon oxide films O1 and O2 included in the multilayer insulating film of the memory gate is missing. By forming silicon nitride films CS1 and CS2 as in this embodiment as an aftertreatment in this state, a semiconductor device having an aspect shown in FIG. 18 is formed.

Even when the silicon nitride film N in the region between the control gate electrode CG and the memory gate electrode MG is eliminated, the functionality of the FMONOS is less affected. However, the silicon nitride film N has a shape extending from the region between the control gate electrode CG and the memory gate electrode MG to the region between the memory gate electrode MG and the semiconductor substrate SUB. Accordingly, if the silicon nitride film N is etched at high speed, it would be eliminated not only in the region between the control gate electrode CG and the memory gate electrode MG but also in the region between the memory gate electrode MG and the semiconductor substrate SUB. This would impair the function of the FMONOS of storing electric charge.

For this reason, in this embodiment, the side wall silicon nitride film SWN formed in the PMOS region is eliminated in a state where the resist pattern PHR serving as a protective film is formed over the FMONOS region and in particular over the nitride film CS1 and the like contacting the top surface of the silicon nitride film N included in the multilayer insulating film in the FMONOS region. This can prevent the silicon nitride film N from being eliminated along with the side wall silicon nitride film SWN in the PMOS region. Thus, the FMONOS to be formed can obtain the function of storing information.

Further, in this embodiment, the nitride film CS1 for applying tensile stress to the channel is formed in the n-channel transistor NMOS, and the nitride film CS2 for applying compressive stress to the channel is formed in the p-channel transistor PMOS. Thus, the current drive capability of the semiconductor device can be enhanced. Furthermore, since the nitride film CS1 for applying tensile stress to the channel is formed in the MONOS-type memory cell FMONOS, the on-off ratio of the memory cell can further be increased.

In this embodiment, for the PMOS, the side wall silicon nitride film SWN is eliminated and thus the distance between the nitride film CS2 and the channel region is reduced. For the NMOS, on the other hand, the side wall silicon nitride film SWN is maintained. Originally, in the NMOS, the current drive capability improvement effect obtained by SPT is as small as 10% or less. Accordingly, even if the side wall silicon nitride film SWN remains in the NMOS, it is no problem.

Second Embodiment

A second embodiment of the present invention differs from the first embodiment in the configuration of the contact etch stopper film and the method for manufacturing this portion. The configuration of this embodiment will be described with reference to FIG. 19.

Figure 19:
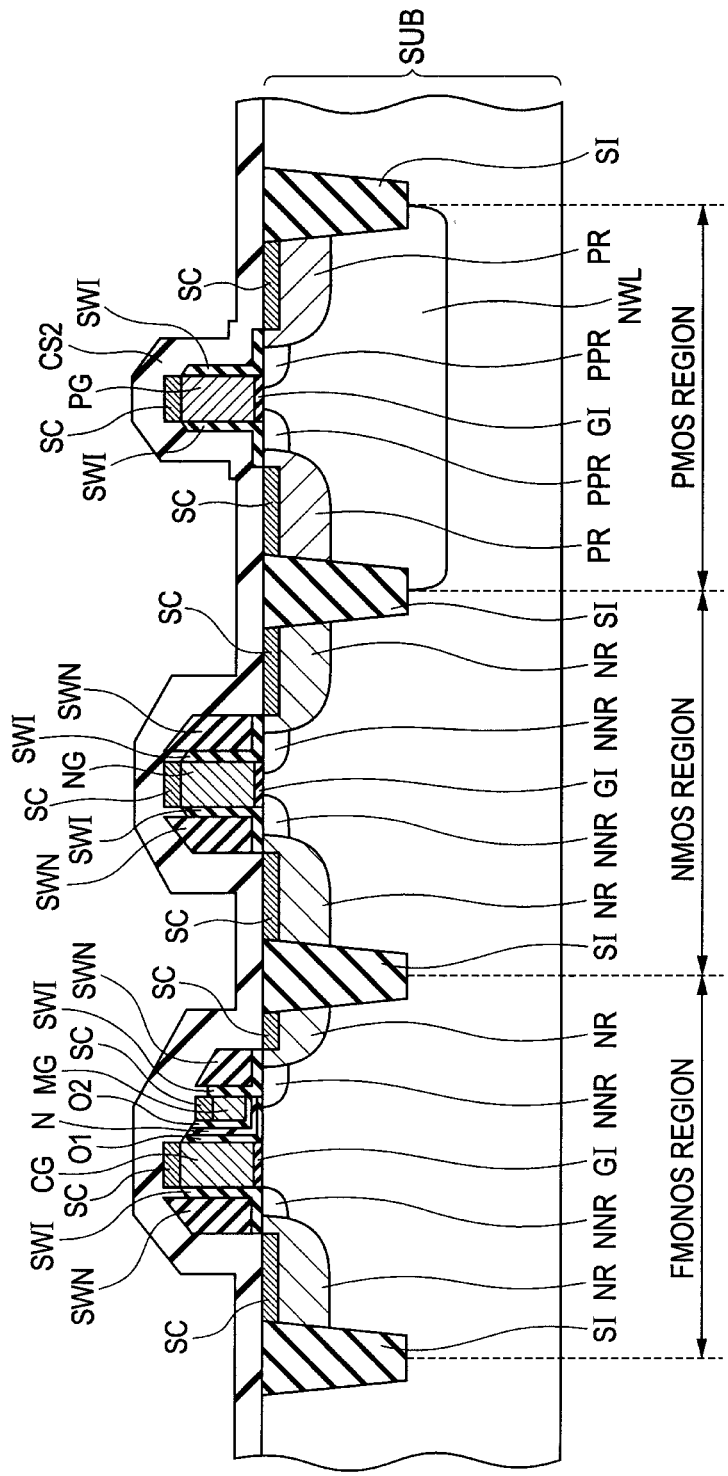
FIG. 19 is a schematic sectional view showing the configurations of a MONOS-type memory cell, an n-channel transistor, and a p-channel transistor similar to those in FIG. 2 in a semiconductor device according to a second embodiment of the present invention.

Referring to FIG. 19, a semiconductor device according to this embodiment differs from the semiconductor device according to the first embodiment shown in FIG. 2 in that the nitride film CS2 for applying compressive stress to the channel region is formed not only in the PMOS region but also in the FMONOS and NMOS regions. Specifically, the nitride film CS1 and the insulating film SII in the semiconductor device of FIG. 2 are not formed in the FMONOS and NMOS regions. Instead, the nitride film CS2 is formed.

In this embodiment, ions of germanium (Ge), silicon, or the like are preferably implanted into the nitride film CS2 in the FMONOS and NMOS regions. This can relax compressive stress applied to the channel region by the nitride film CS2 in the n-channel FMONOS and NMOS regions. That is, in this embodiment, compressive stress applied to the channel region by the nitride film CS2 in the FMONOS and NMOS regions is preferably smaller than that applied to the channel region by the nitride film CS2 in the PMOS region.

The semiconductor device of FIG. 19 is the same as the semiconductor device of FIG. 2 except for the above-mentioned point. Accordingly, same elements are given same signs and will not be described repeatedly.

Next, a method for manufacturing the semiconductor device according to this embodiment shown in FIG. 19 will be described with reference to FIG. 20.

Figure 20:
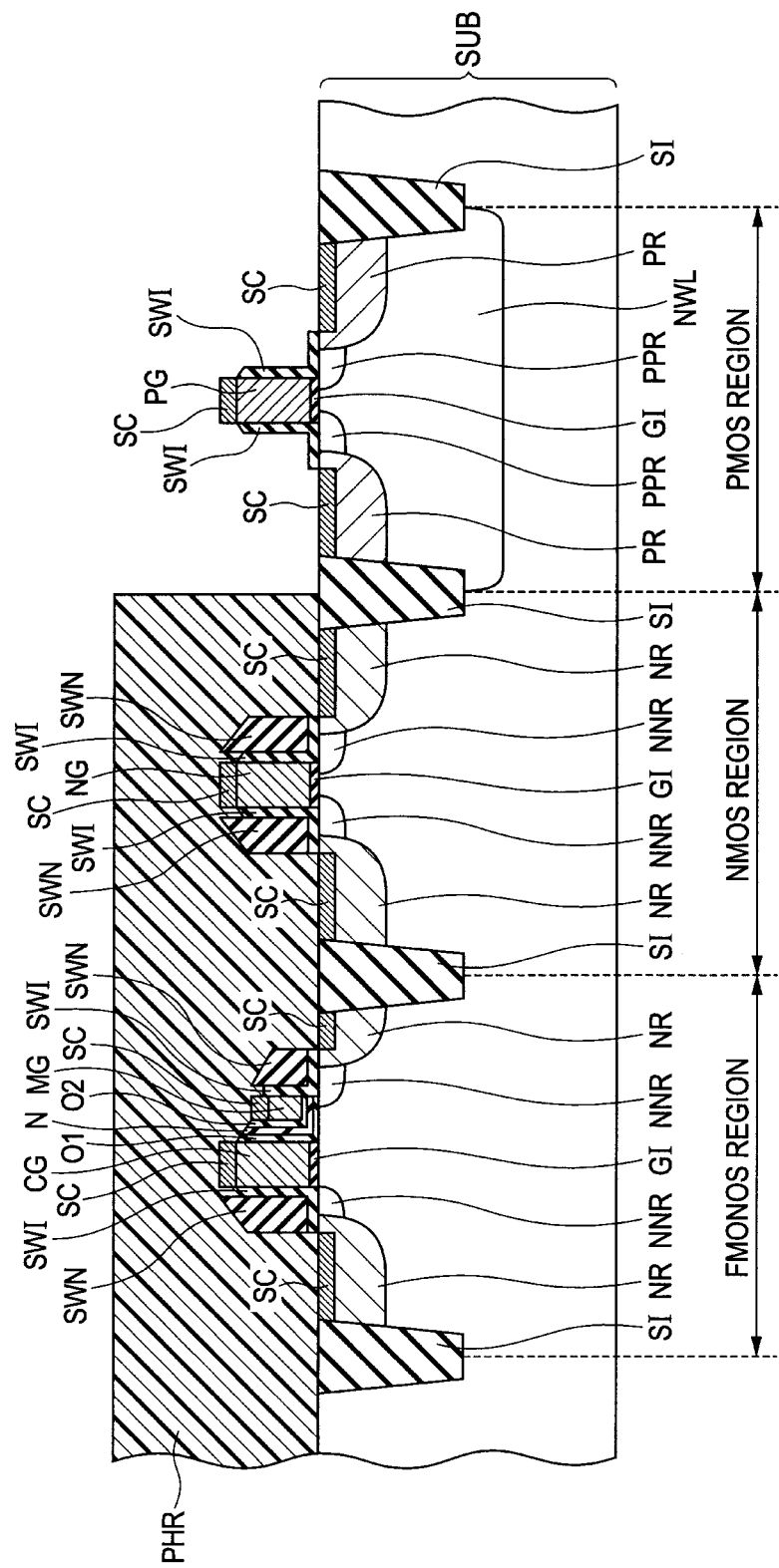
FIG. 20 is a schematic sectional view showing a step following FIG. 12 in a method for manufacturing the semiconductor device according to the second embodiment of the present invention.

Referring to FIG. 20, in the method for manufacturing the semiconductor device according to this embodiment, a resist pattern PHR (protective film) having an aperture in the PMOS region (covering the top surfaces of the FMONOS and NMOS regions) is formed as in the step of FIG. 14 after steps similar to FIGS. 3 to 12. Using the resist pattern PHR as a mask, the side wall silicon nitride film SWN in the PMOS region is eliminated by ordinary etching. That is, the side wall silicon nitride film SWN in the PMOS region is eliminated in a state where the resist pattern PHR serving as a protective film is covering the top surface of the silicon nitride film N in the FMONOS region. As a result, the side wall silicon nitride film SWN in the FMONOS and NMOS regions is maintained.

After the resist pattern PHR is eliminated in the step of FIG. 20, a nitride film CS2 is formed over the main surface of the semiconductor substrate SUB as in the step of FIG. 15 in a manner to cover the FMONOS, NMOS, and PMOS regions. The semiconductor device shown in FIG. 19 is formed in this way.

Although not shown, ions of germanium, silicon, or the like may be implanted into the nitride film CS2 formed in the FMONOS and NMOS regions by, e.g., normal implantation technique.

Next, advantages of this embodiment will be described. In this embodiment also, the nitride film CS2 capable of applying compressive stress is formed in the PMOS region, as in the first embodiment. Thus, the current drive capability of the PMOS is enhanced. Further, since the side wall silicon nitride film SWN is not formed in the PMOS, the distance between the nitride film CS2 for applying compressive stress and the channel region is reduced. Thus, the nitride film CS2 can more efficiently apply compressive stress to the channel region of the PMOS.

In this embodiment, the resist pattern PHR formed in the step shown in FIG. 20 and serving as a protective film has an effect of preventing the side wall silicon nitride film SWN in the FMONOS and NMOS regions from being etched along with the silicon nitride film N. Accordingly, the side wall silicon nitride film SWN can increase the distance between the nitride film CS2 and the channel region in the FMONOS and NMOS. Since the FMONOS and NMOS are an n-channel memory cell (transistor), application of tensile stress to the channel region can enhance the current drive capability. Further, since the side wall silicon nitride film SWN increases the distance between the nitride film CS2 and the channel region in the FMONOS and NMOS, compressive stress applied to the channel region by the nitride film CS2 is reduced. Thus, reductions in the current drive capability can be controlled.

In this embodiment, the nitride film CS2 is formed in all of the FMONOS, NMOS, and PMOS regions. Thus, the number of steps can be reduced compared to a case where the silicon nitride films CS1 and CS2 are formed in different steps as in the first embodiment.

This embodiment is the same as the first embodiment except for the above-mentioned points. That is, the configuration, conditions, steps, advantages, and the like of the second embodiment that are not described above are all the same as those of the first embodiment.

Third Embodiment

A third embodiment of the present invention differs from the first embodiment in the configuration of the PMOS and the method for manufacturing this portion. Hereafter, the configuration of this embodiment will be described with reference to FIG. 21.

Figure 21:
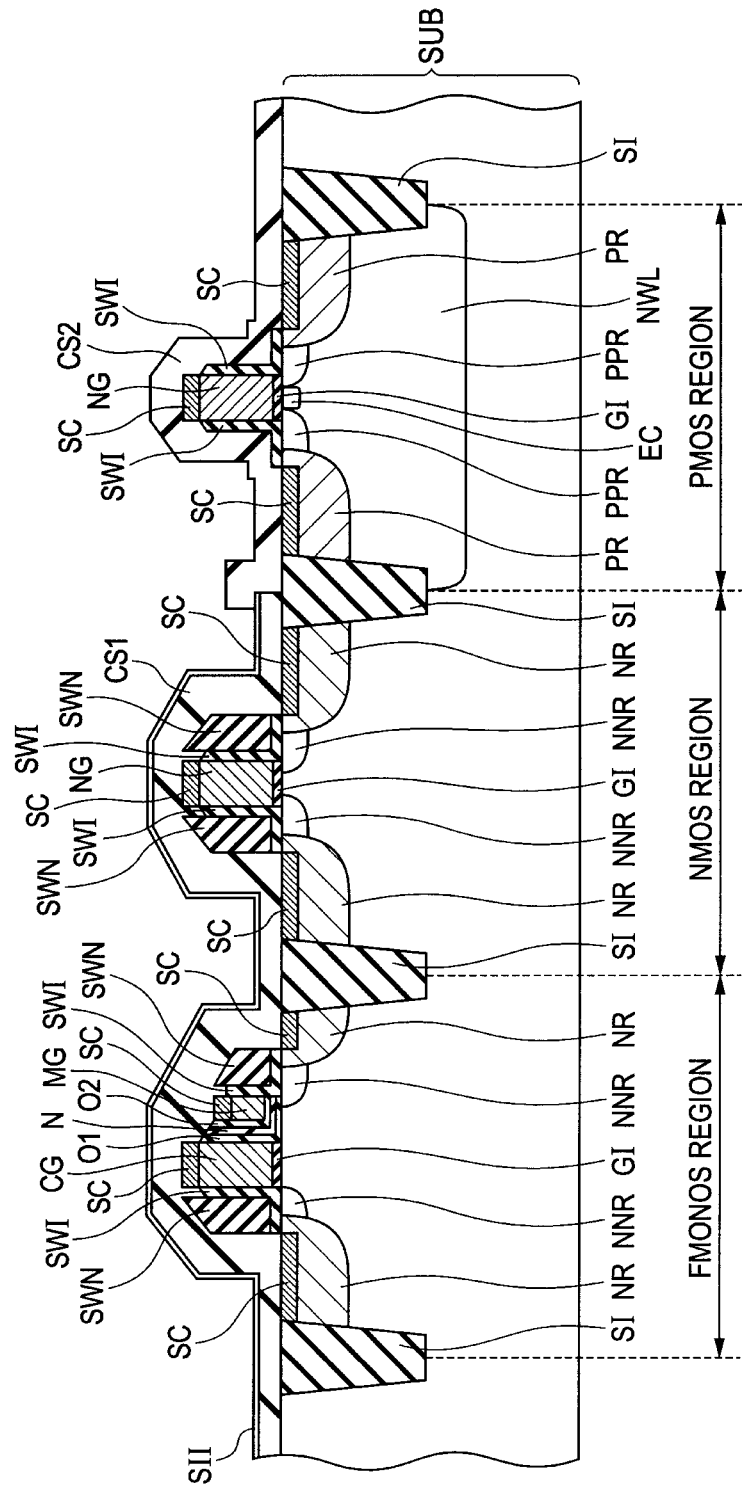
FIG. 21 is a schematic sectional view showing the configurations of a MONOS-type memory cell, an n-channel transistor, and a p-channel transistor similar to those in FIG. 2 in a semiconductor device according to a third embodiment of the present invention.

Referring to FIG. 21, in this embodiment, a so-called embedded channel EC serving as a p-type impurity region is formed in the channel region between the source region and the drain region of the PMOS. Further, in this embodiment, an n-type gate electrode NG including polycrystalline silicon containing an n-type impurity is used as the gate electrode included in the PMOS.

The semiconductor device of FIG. 21 is the same as the semiconductor device of FIG. 2 except for the above-mentioned points. Accordingly, same elements are given same signs and will not be described repeatedly.

Next, a method for manufacturing the semiconductor device according to this embodiment shown in FIG. 21 will be described with reference to FIGS. 22 to 25.

Figure 22:
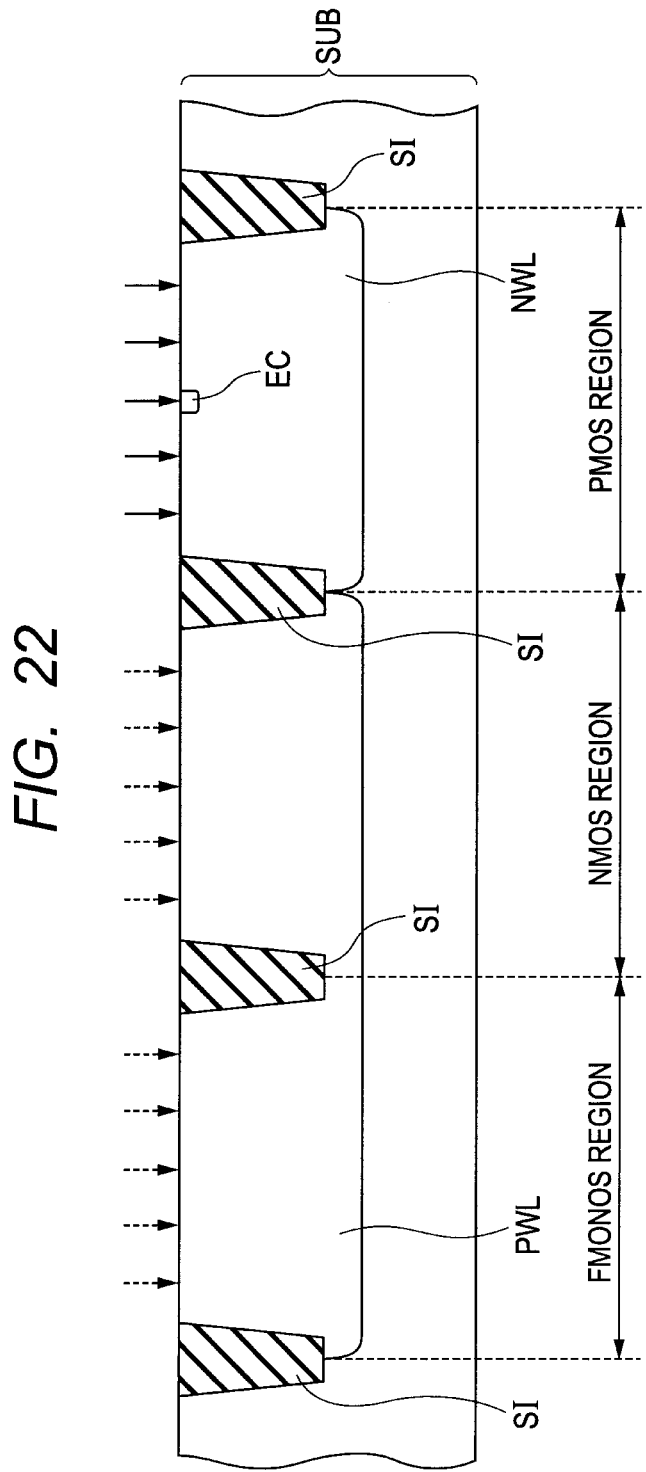
FIG. 22 is a schematic sectional view showing a step corresponding to the step shown in FIG. 3 of the first embodiment in a method for manufacturing the semiconductor device according to the third embodiment of the present invention.

Referring to FIG. 22, in the method for manufacturing the semiconductor device according to this embodiment, ions of a p-type impurity such as boron are implanted into part of a surface of the semiconductor substrate SUB in the n-type well region NWL by ordinary implantation technique after a step similar to FIG. 3. Thus, a p-type impurity region is formed. Specifically, an embedded channel EC containing a p-type impurity is formed in the region (the region where a channel region is to be formed) between a source and a drain to be formed later on the surface of the semiconductor substrate SUB in the n-type well region NWL.

Figure 23:
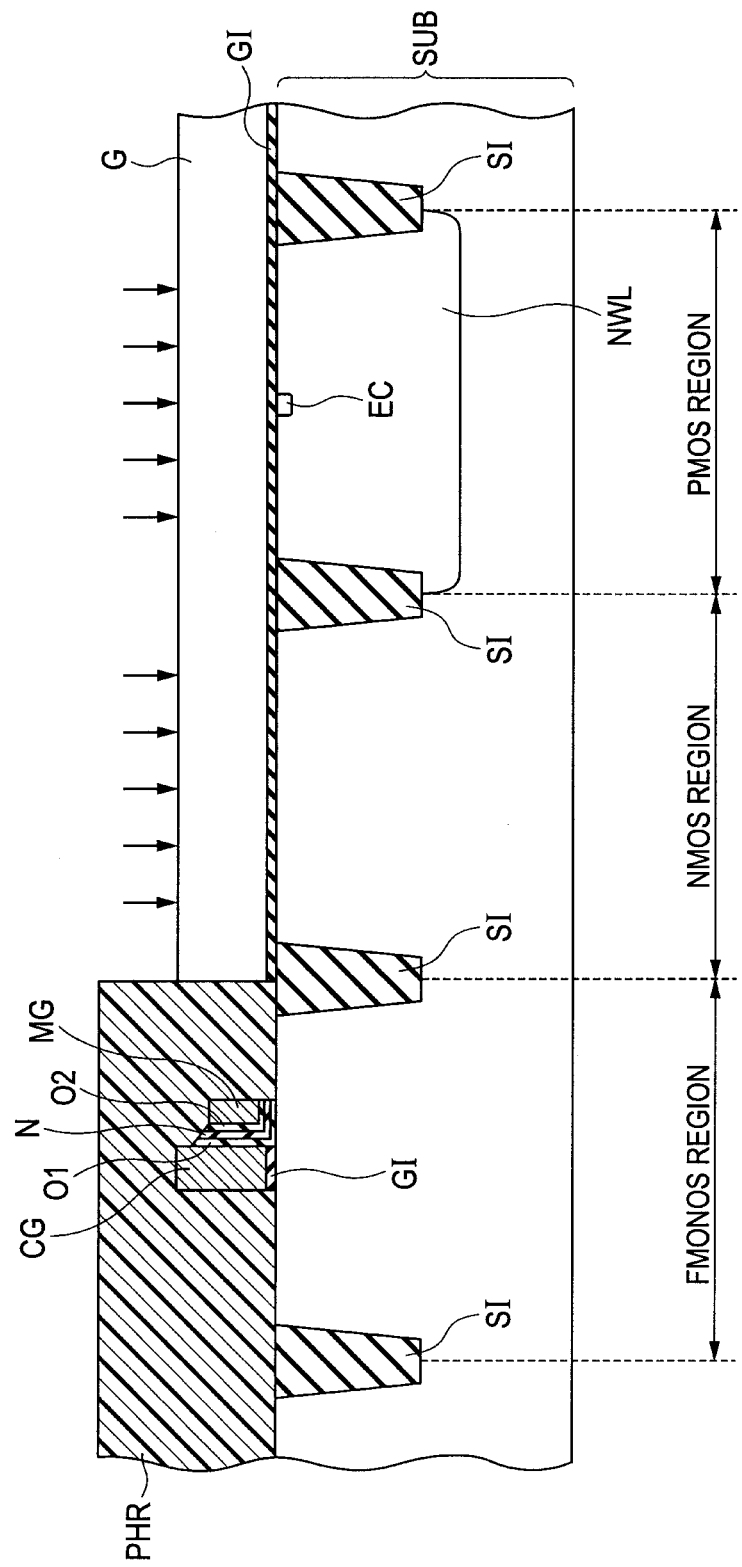
FIG. 23 is a schematic sectional view showing a step corresponding to the step shown in FIG. 7 of the first embodiment in the method for manufacturing the semiconductor device according to the third embodiment of the present invention.

Referring to FIG. 23, steps similar to FIGS. 4 to 6 are performed after the step of FIG. 22. Thus, a control unit and a memory gate are formed as in the step of FIG. 7. Subsequently, a resist pattern PHR having an aperture in the NMOS and PNOS regions is formed and then ions of an n-type impurity such as arsenic or phosphorous are implanted into polycrystalline silicon Gin the NMOS and PNOS regions by ordinary photoengraving.

Figure 24:
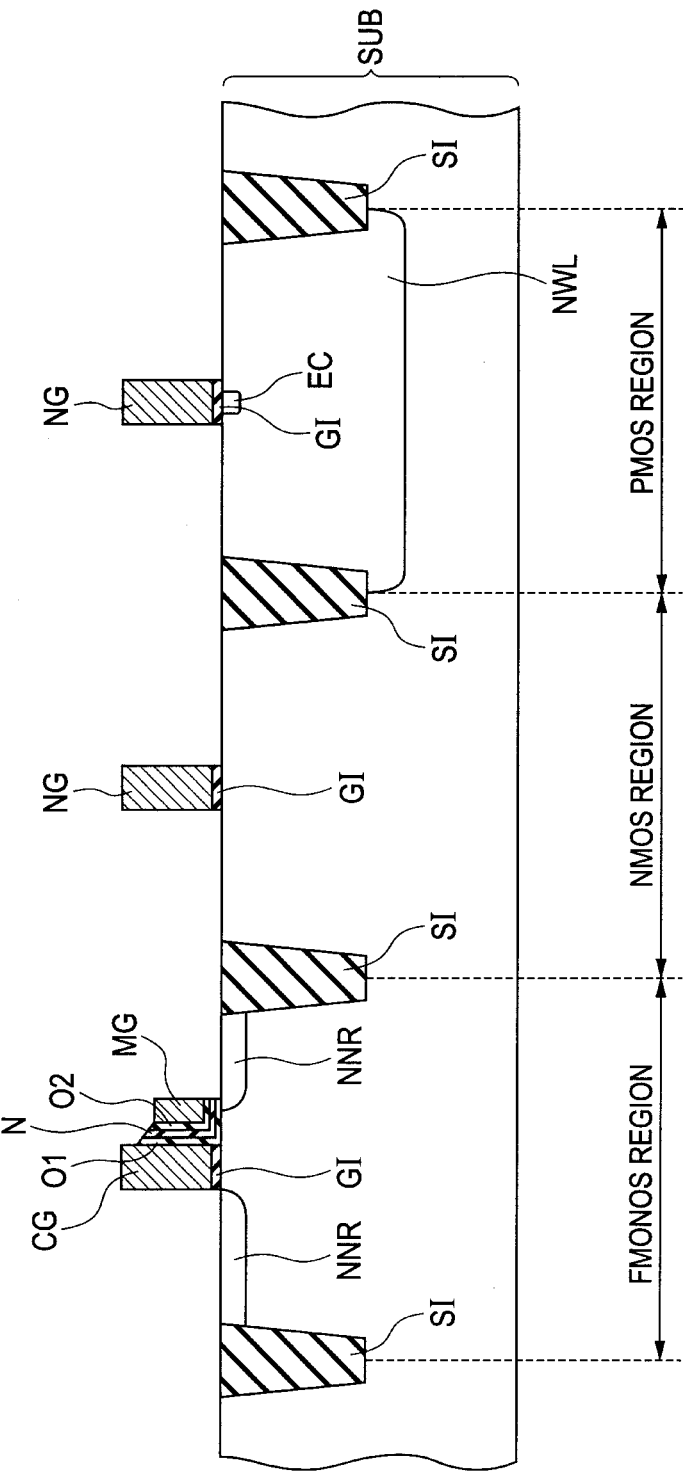
FIG. 24 is a schematic sectional view showing a step corresponding to the step shown in FIG. 8 of the first embodiment in the method for manufacturing the semiconductor device according to the third embodiment of the present invention.

Referring to FIG. 24, the polycrystalline silicon G and the gate insulating film GI in the NMOS and PMOS regions are patterned as in the step of FIG. 8 after the step of FIG. 23. Thus, an NMOS is formed as an n-type gate electrode NG and a gate insulating film GI, and a PMOS is formed as an n-type gate electrode NG and a gate insulating film GI.

Figure 25:
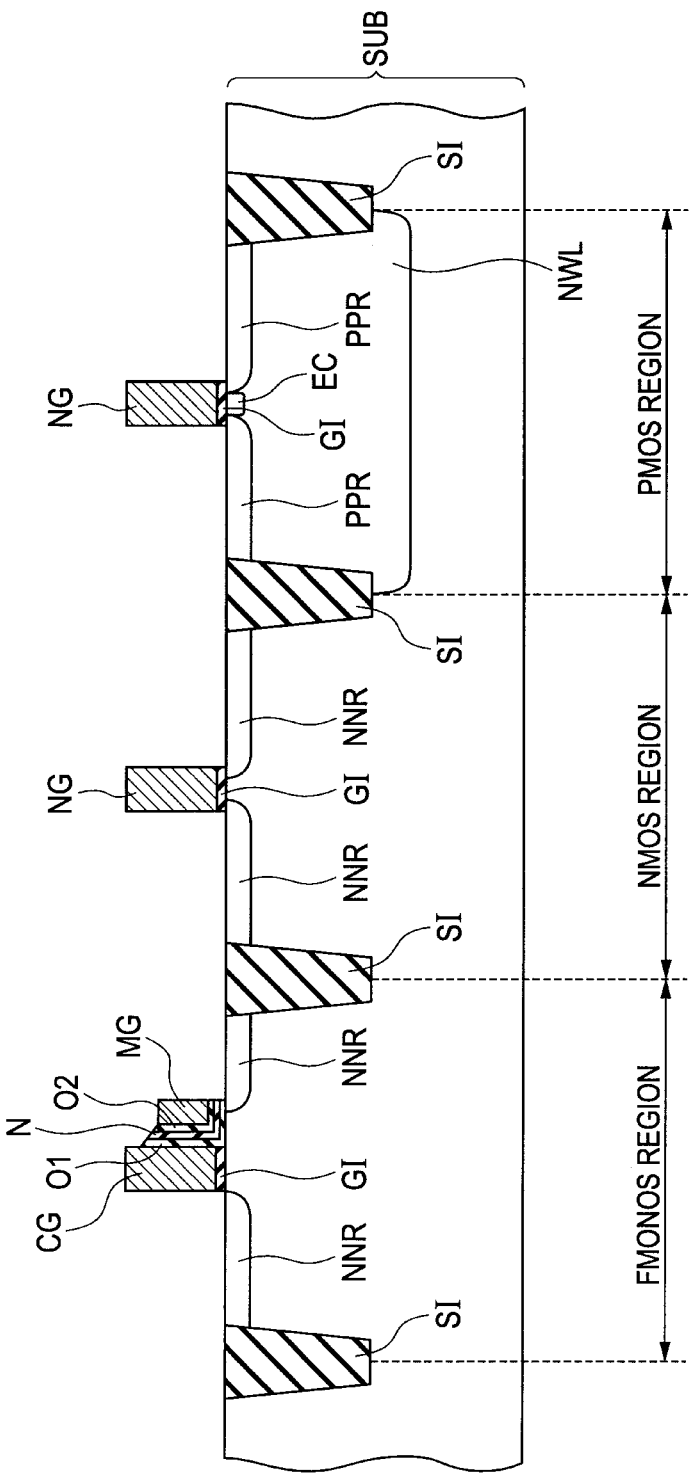
FIG. 25 is a schematic sectional view showing a step corresponding to the step shown in FIG. 9 of the first embodiment in the method for manufacturing the semiconductor device according to the third embodiment of the present invention.

Referring to FIG. 25, a step similar to the step of FIG. 9 is performed after the step of FIG. 24. Thus, an embedded channel EC is disposed in the region between a pair of low-concentration p-type impurity regions PPR formed in the PMOS region. Hereafter, steps similar to those of FIGS. 10 to 16 are performed, forming the semiconductor device shown in FIG. 21.

Next, advantages of this embodiment will be described. In addition to the advantages of the first embodiment, this embodiment has an advantage that a mask used to form a p-type gate electrode (to implant a p-type impurity) is made unnecessary by forming the PMOS as the n-type gate electrode NG. As a result, the manufacturing cost of the mask can be eliminated.

A configuration including the embedded channel EC according to this embodiment may be applied to the other embodiments herein.

This embodiment is the same as the first embodiment except for the above-mentioned points. That is, the configuration, conditions, steps, advantages, and the like of the third embodiment that are not described above are all the same as the first embodiment.

Fourth Embodiment

A fourth embodiment of the present invention differs from the first embodiment in the configurations of the FMONOS and NMOS and the method for manufacturing these portions. The configuration of this embodiment will be described with reference to FIG. 26.

Figure 26:
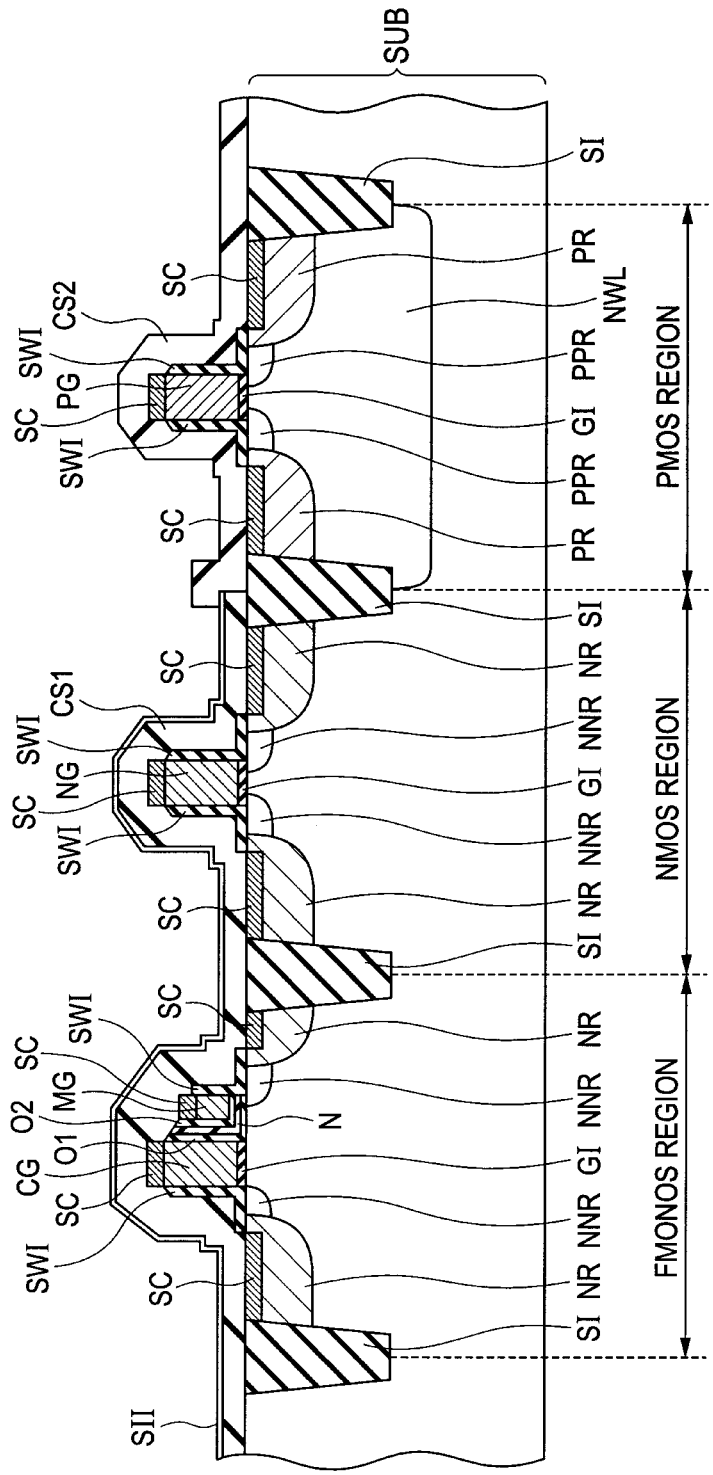
FIG. 26 is a schematic sectional view showing the configurations of a MONOS-type memory cell, an n-channel transistor, and a p-channel transistor similar to those in FIG. 2 in a semiconductor device according to a fourth embodiment of the present invention.

Referring to FIG. 26, in this embodiment, the side wall silicon oxide film SWI is formed in a manner to contact the outer side wall of the multilayer structure formed by the gate insulating film GI and the gate electrodes CG, MG, NG, and PG, in all of the FMONOS, NMOS, and PMOS. The side wall silicon oxide film SWI is preferably formed in a manner to cover the main surface of the semiconductor substrate SUB and the side surfaces of the gate electrodes CG, MG, NG, and PG. The thickness thereof is preferably 10 nm or less. On the other hand, in this embodiment, the side wall silicon nitride film SWN (FIG. 2) is not formed in any of the FMONOS, NMOS, and PMOS.

Further, in this embodiment, the portion between the control gate electrode CG and the memory gate electrode MG, of the silicon nitride film N included in the memory gate of the FMONOS is eliminated from above to some extent by etching.

Thus, the uppermost portion of the silicon nitride film N in the region between the control gate electrode CG and the memory gate electrode MG is lower than the uppermost surface of the memory gate electrode MG and higher than the lowermost surface of the memory gate electrode MG. Where silicide SC is formed in an manner to contact the top surface of the memory gate electrode MG, the uppermost portion of the silicon nitride film N in the region between the control gate electrode CG and the memory gate electrode MG is preferably lower than the uppermost surface of the silicide SC and higher than the lowermost surface of the memory gate electrode MG. In any case, the silicon nitride film N is disposed in the region between the memory gate electrode MG and the semiconductor substrate SUB, as in the other embodiments.

The semiconductor device of FIG. 26 is the same as the semiconductor device of FIG. 2 except for the above-mentioned points. Accordingly, same elements are given same signs and will not be described repeatedly.

Next, a method for manufacturing the semiconductor device according to this embodiment shown in FIG. 26 will be described with reference to FIGS. 27 to 29.

Figure 27:
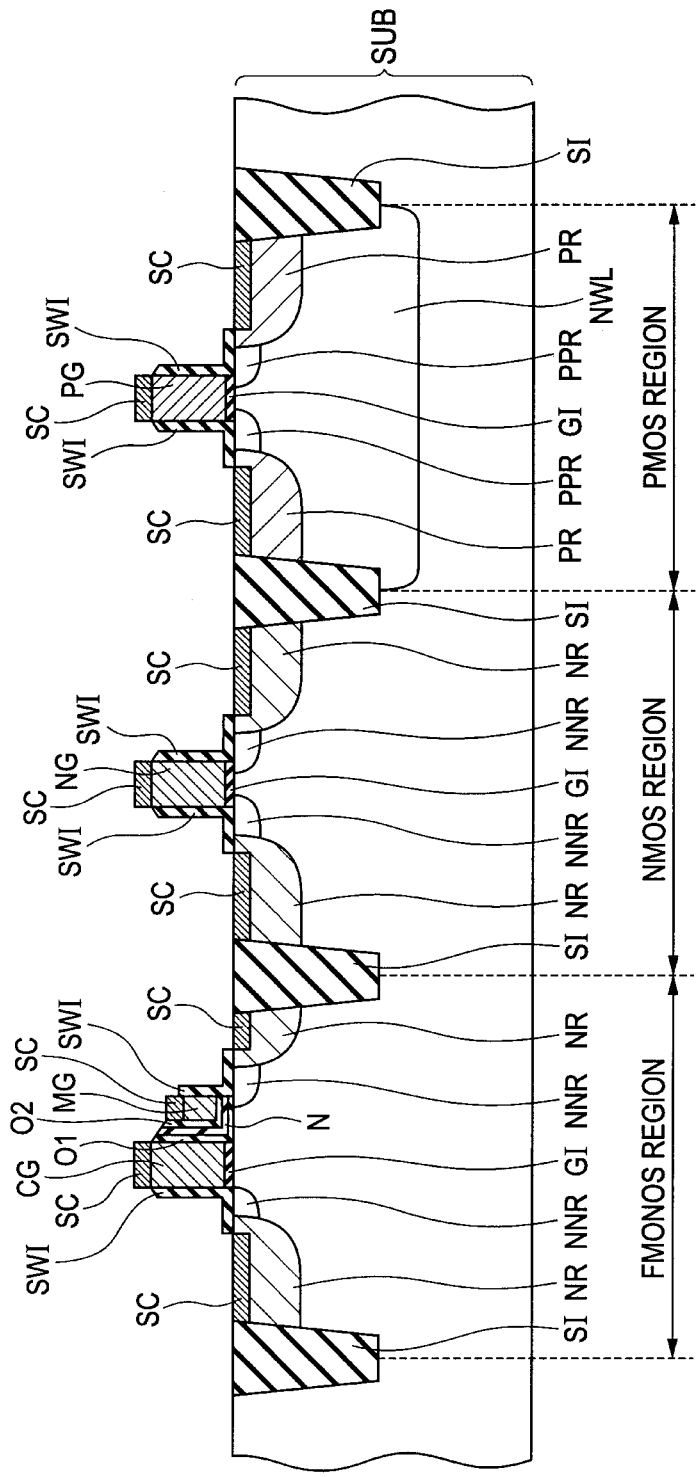
FIG. 27 is a schematic sectional view showing a step following FIG. 12 in a method for manufacturing the semiconductor device according to the fourth embodiment of the present invention.

Referring to FIG. 27, in the method for manufacturing the semiconductor device according to this embodiment, the side wall silicon nitride film SWN in all of the FMONOS, NMOS, and PMOS regions is eliminated by, e.g., wet etching after steps similar to those of FIGS. 3 to 12. Simultaneously, the silicon nitride film N included in the memory gate of the FMONOS is eliminated from above to some extent.

The silicide SC is formed over the top surface of the memory gate electrode MG. For this reason, part of the silicon nitride film N in the region between the control gate electrode CG and the memory gate electrode MG is preferably etched in such a manner that the height of the uppermost portion of the remaining silicon nitride film N is lower than the uppermost surface of the silicide SC and higher than the lowermost surface of the memory gate electrode MG. Further, only part of the upper portion of the silicon nitride film N in the region between the control gate electrode CG and the memory gate electrode MG is preferably eliminated. Furthermore, the silicon nitride film N between the memory gate electrode MG and the semiconductor substrate SUB is preferably left without being eliminated.

To etch only part of the silicon nitride film N as described above, the side wall silicon nitride film SWN, which is etched along with the silicon nitride film N, is preferably etched isotropically. Specifically, the etching speed in the horizontal direction in FIG. 27 is made higher than that in the vertical direction in FIG. 27. Thus, the side wall silicon nitride film SWN is etched at higher etching speed in the horizontal direction. On the other hand, the silicon nitride film N is etched from above at lower etching speed. Accordingly, for the silicon nitride film N between the control gate electrode CG and the memory gate electrode MG, only part of the upper portion thereof is eliminated. The etching is stopped at the point in time when the entire side wall silicon nitride film SWN is etched in the horizontal direction. Thus, the silicon nitride film N formed between the memory gate electrode MG and the semiconductor substrate SUB is maintained without being eliminated.

Figure 28:
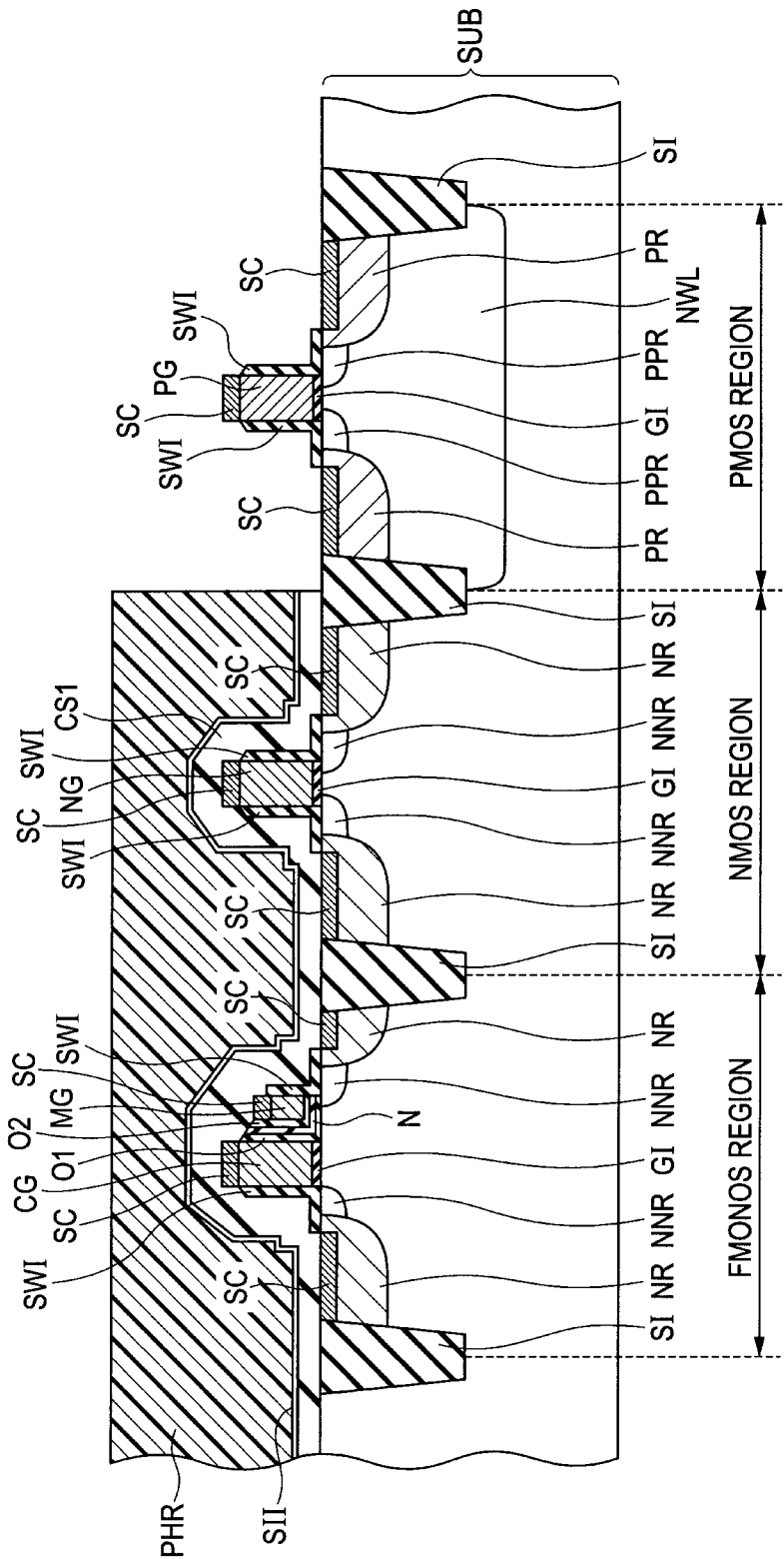
FIG. 28 is a schematic sectional view showing a step corresponding to the step shown in FIG. 14 of the first embodiment in the method for manufacturing the semiconductor device according to the fourth embodiment of the present invention.
Figure 29:
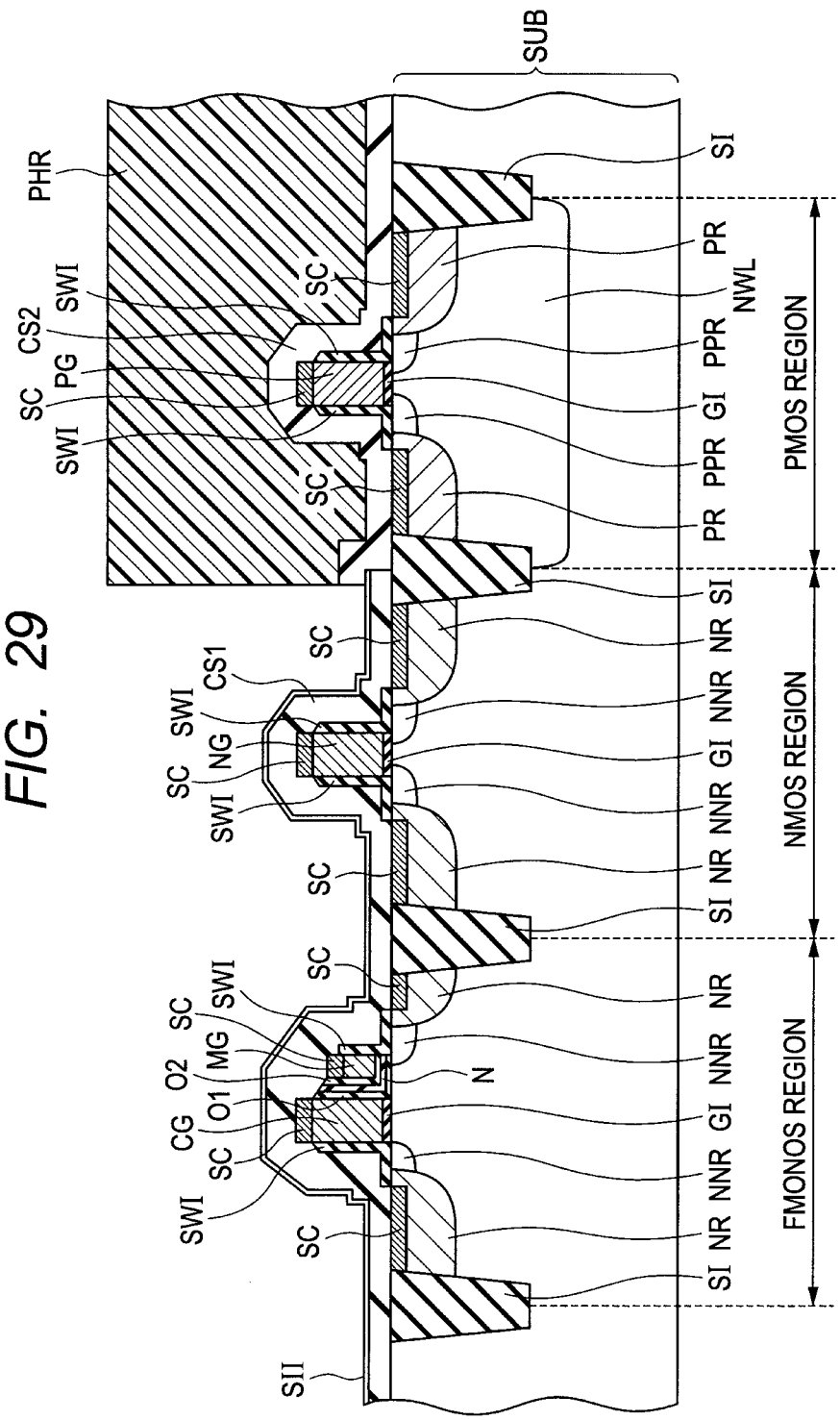
FIG. 29 is a schematic sectional view showing a step corresponding to the step shown in FIG. 16 of the first embodiment in the method for manufacturing the semiconductor device according to the fourth embodiment of the present invention.

Referring to FIG. 28, steps similar to the steps of FIGS. 13 to 14 are performed after the step of FIG. 27. Referring to FIG. 29, steps similar to the steps of FIGS. 15 to 16 are performed after the step of FIG. 28. A resist pattern PHR of FIG. 29 is eliminated, forming the semiconductor device shown in FIG. 26.

Next, advantages of this embodiment will be described. In this embodiment, the side wall silicon nitride film SWN is eliminated from the PMOS, as well as from the FMONOS and the NMOS. In this state, the nitride film CS1 having tensile stress is formed over the top surfaces of the FMONOS and the NMOS, and the nitride film CS2 having compressive stress is formed over the top surface of the PMOS. Thus, in the FMONOS and NMOS also, the distance between the nitride film CS1 and the channel region is reduced, as in the PMOS. As a result, the nitride film CS1 can more efficiently apply compressive stress to the channel region of the PMOS; the on-off ratio of the FMONOS as a memory cell can be increased; and the current drive capability of the NMOS can be enhanced.

Further, by setting the thickness of the side wall silicon oxide film SWI in the FMONOS and the NMOS (PMOS) to 10 nm or less, the distance between the nitride film CS1 and the channel region in the FMONOS and the NMOS can be set such that the nitride film CS1 can apply sufficient tensile stress to the channel region.

For the silicon nitride film N, only part thereof in the region between the control gate electrode CG and the memory gate electrode MG is etched; it is maintained in the other regions. Such elimination of only the top portion of the silicon nitride film N in the region between the control gate electrode CG and the memory gate electrode MG is allowable in terms of maintenance of the functionality of the FMONOS. Thus, the on-off ratio of the FMONOS as a memory cell can be increased without impairing the functionality of the FMONOS.

This embodiment is the same as the first embodiment except for the above-mentioned points. That is, the configuration, conditions, steps, advantages, and the like of the fourth embodiment that are not described above are all the same as those of the first embodiment.

The embodiments disclosed herein should be construed as being illustrative and not limiting in all respects. The scope of the present invention is defined not by the foregoing description but by the appended claims and is intended to include meanings equivalent to the claims and any changes within the scope. Further, the configurations of the above-mentioned embodiments may be combined as appropriate.

The present invention is particularly advantageously applicable to semiconductor devices including an FMONOS and CMOS and manufacturing methods thereof.

What is claimed is:

1. A semiconductor device comprising:
   a semiconductor substrate having a main surface;
   a MONOS-type memory cell formed over the main surface and having a channel;
   an n-channel transistor formed over the main surface;
   a p-channel transistor formed over the main surface; and
   a nitride film formed in a manner to contact respective top surfaces of the MONOS-type memory cell, the n-channel transistor, wherein the nitride film applies stress to the channels of the MONOS-type memory cell, the n-channel transistor, and the p-channel transistor, the MONOS-type memory cell, the n-channel transistor, and the p-channel transistor each include a gate electrode, the MONOS-type memory cell and the n-channel transistor each include a first side wall silicon oxide film and a first side wall silicon nitride film that are layered in this order in a manner to contact a side wall of the gate electrode, and the first side wall silicon oxide film and the first side wall silicon nitride film are covered by the nitride film, and the p-channel transistor includes a second side wall silicon oxide film formed over a side wall surface of the gate electrode, the second side wall silicon oxide film being covered by the nitride film, but includes no side wall silicon nitride film, between the second side wall silicon oxide film and the nitride film, that is included in the MONOS-type memory cell and the n-channel transistor.

2. The semiconductor device according to claim 1, wherein the nitride film applies compressive stress to the channels of the MONOS-type memory cell, the n-channel transistor, and the p-channel transistor.

3. The semiconductor device according to claim 1,
wherein the nitride film applies compressive stress to the channels of the MONOS-type memory cell, the n-channel transistor, and the p-channel transistor, and
wherein compressive stress applied to the MONOS-type memory cell and the n-channel transistor by the nitride film is smaller than compressive stress applied to the p-channel transistor thereby.

4. The semiconductor device according to claim 1, wherein the nitride film includes a first nitride film that applies tensile stress to the channels of the MONOS-type memory cell and the n-channel transistor and a second nitride film that applies compressive stress to the channel of the p-channel transistor.

5. The semiconductor device according to any one of claims 1 to 4,
wherein the p-channel transistor includes the gate electrode,
wherein an impurity region is formed in a region of the p-channel transistor, the region being a region where the channel is to be formed, and
wherein the gate electrode of the p-channel transistor contains an n-type impurity.

6. The semiconductor device according to claim 1, wherein the first side wall silicon oxide films of the MONOS-type memory cell and the n-channel transistor have a thickness of 10 nm or less.

7. The semiconductor device according to claim 6,
wherein the gate electrode of the MONOS-type memory cell includes a control gate electrode and a memory gate electrode,
wherein the MONOS-type memory cell includes a nitride insulator layer formed between the memory gate electrode and the semiconductor substrate and intended to store electric charge in the MONOS-type memory cell,
wherein the nitride insulator layer extends from a region between the memory gate electrode and the semiconductor substrate to a region between the control gate electrode and the memory gate electrode, and
wherein an uppermost portion of the nitride insulator layer in the region between the control gate electrode and the memory gate electrode is lower than an uppermost surface of the control gate electrode and higher than a lowermost surface of the memory gate electrode.

8. The semiconductor device according to any one of claims 1, 6, and 7,
wherein an impurity region is formed in a region of the p-channel transistor where the channel is to be formed, and
wherein the gate electrode of the p-channel transistor contains an n-type impurity.

* * * * *

UNITED STATES PATENT AND TRADEMARK OFFICE
CERTIFICATE OF CORRECTION

| | | |
|---|---|---|
| PATENT NO. | : 8,912,590 B2 | Page 1 of 1 |
| APPLICATION NO. | : 13/471949 | |
| DATED | : December 16, 2014 | |
| INVENTOR(S) | : Yuichi Hirano | |

It is certified that error appears in the above-identified patent and that said Letters Patent is hereby corrected as shown below:

On the Title page, item (57) ABSTRACT should read:

-- A semiconductor device includes a semiconductor substrate having a main surface, a MONOS-type memory cell formed over the main surface and having a channel, an n-channel transistor formed over the main surface, and a p-channel transistor formed over the main surface. Nitride films are formed in a manner to contact the top surfaces of the MONOS-type memory cell, the n-channel transistor, and the p-channel transistor. The nitride films apply stress to the channels of the MONOS-type memory cell, the n-channel transistor, and the p-channel transistor. --.

Signed and Sealed this
Seventh Day of July, 2015

Michelle K. Lee
*Director of the United States Patent and Trademark Office*